(12) United States Patent
Howald et al.

(10) Patent No.: US 10,276,350 B2
(45) Date of Patent: *Apr. 30, 2019

(54) SYSTEMS AND METHODS FOR USING COMPUTER-GENERATED MODELS TO REDUCE REFLECTED POWER TOWARDS AN RF GENERATOR DURING STATE TRANSITIONS OF THE RF GENERATOR BY CONTROLLING RF VALUES OF THE RF GENERATOR

(71) Applicant: Lam Research Corporation, Fremont, CA (US)

(72) Inventors: Arthur M. Howald, Livermore, CA (US); John C. Valcore, Jr., Fremont, CA (US); Andrew Fong, Pleasanton, CA (US); David Hopkins, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 232 days.

This patent is subject to a terminal disclaimer.

(21) Appl. No.: 15/098,566

(22) Filed: Apr. 14, 2016

(65) Prior Publication Data

US 2016/0307736 A1   Oct. 20, 2016

Related U.S. Application Data

(63) Continuation-in-part of application No. 15/098,189, filed on Apr. 13, 2016, now Pat. No. 9,711,332, and a continuation-in-part of application No. 14/245,803, filed on Apr. 4, 2014, now Pat. No. 9,779,196.

(60) Provisional application No. 61/821,523, filed on May 9, 2013.

(51) Int. Cl.
*G01R 19/00* (2006.01)
*H01J 37/32* (2006.01)
*G06F 17/50* (2006.01)

(52) U.S. Cl.
CPC .... *H01J 37/32183* (2013.01); *G06F 17/5063* (2013.01); *H01J 37/32926* (2013.01)

(58) Field of Classification Search
CPC .................. H04B 1/0475; H01J 37/32183
USPC ....................................................... 702/64
See application file for complete search history.

(56) References Cited

U.S. PATENT DOCUMENTS

| | | | |
|---|---|---|---|
| 5,187,454 A | 2/1993 | Collins et al. | |
| 6,259,334 B1 | 7/2001 | Howald | |
| 2004/0027069 A1* | 2/2004 | Kim | H05K 7/20963 313/582 |
| 2005/0029954 A1* | 2/2005 | Yokoshima | H01J 37/32192 315/111.21 |
| 2010/0133974 A1* | 6/2010 | Cho | H01J 11/12 313/110 |
| 2014/0214395 A1 | 7/2014 | Valcore, Jr. et al. | |

* cited by examiner

*Primary Examiner* — Caleb E Henry
(74) *Attorney, Agent, or Firm* — Penilla IP, APC

(57) ABSTRACT

Systems and methods for tuning an impedance matching network in a step-wise fashion for each state transition are described. By tuning the impedance matching network in a step-wise fashion for each state transition instead of directly achieving an optimal value of a combined variable capacitance for each state, processing of a wafer using the tuned optimal values becomes feasible.

14 Claims, 11 Drawing Sheets

SYSTEMS AND METHODS FOR USING COMPUTER-GENERATED MODELS TO REDUCE REFLECTED POWER TOWARDS AN RF GENERATOR DURING STATE TRANSITIONS OF THE RF GENERATOR BY CONTROLLING RF VALUES OF THE RF GENERATOR

CLAIM OF PRIORITY

This application is a continuation-in-part of and claims the benefit, under 35 U.S.C. § 120, of co-pending U.S. patent application Ser. No. 14/245,803, filed on Apr. 4, 2014, and entitled "SEGMENTING A MODEL WITHIN A PLASMA SYSTEM", which is incorporated by reference herein in its entirety.

The U.S. patent application Ser. No. 14/245,803, filed on Apr. 4, 2014, and titled "SEGMENTING A MODEL WITHIN A PLASMA SYSTEM", claims priority, under 35 U.S.C. § 119(e), to U.S. provisional patent application No. 61/821,523, filed on May 9, 2013, and titled "SEGMENTING A MODEL WITHIN A PLASMA SYSTEM".

This application is a continuation-in-part of and claims the benefit, under 35 U.S.C. § 120, of co-pending U.S. patent application Ser. No. 15/098,189, filed on Apr. 13, 2016, entitled "SYSTEMS AND METHODS FOR TUNING AN IMPEDANCE MATCHING NETWORK IN A STEP-WISE FASHION FOR MULTIPLE STATES OF AN RF GENERATOR", which is incorporated by reference herein in its entirety.

FIELD

The present embodiments relate to systems and methods for reducing reflected power during state transitions by using radio frequency (RF) values.

BACKGROUND

Plasma systems are used to control plasma processes. A plasma system includes multiple radio frequency (RF) sources, an impedance match, and a plasma reactor. A workpiece is placed inside the plasma chamber and plasma is generated within the plasma chamber to process the workpiece. It is important that the workpiece be processed in a similar or uniform manner. To process the workpiece in a similar or uniform manner, it is important that the RF sources and the impedance match be tuned.

It is in this context that embodiments described in the present disclosure arise.

SUMMARY

Embodiments of the disclosure provide apparatus, methods and computer programs for reducing reflected power during state transitions by using radio frequency (RF) values. It should be appreciated that the present embodiments can be implemented in numerous ways, e.g., a process, an apparatus, a system, a piece of hardware, or a method on a computer-readable medium. Several embodiments are described below.

In some embodiments, an impedance matching network and an RF generator are tuned. A model system, which includes a model of the impedance matching network, calculates tune trajectories. A host computer system that controls the impedance matching network and the RF generator is programmed to control a motor-driven variable capacitor of the impedance matching network and to provide frequency setpoints to the RF generator during a transition between two consecutive states of the RF generator.

In various embodiments, RF pulse edge shapes of an RF signal generated by the RF generator are controlled. An RF pulse edge is an edge between two consecutive states.

In several embodiments, RF values to be applied to the RF generator are calculated during an initial state transition, e.g., a state transition ST1 or a state transition ST2, etc. The RF values are calculated using the model system and using load impedance values applied at an output of the model system. The RF values are calculated to minimize values of a reflection coefficient at an input of the model system. The load impedance values are determined from parameter values, e.g., load impedance values, voltage reflection coefficient values, etc., calculated during the initial state transition using a plasma system. The RF values are applied to the RF generator during a following state transition that is of the same type as the initial state transition.

Some advantages of the herein described systems and methods include determination of the RF values during the initial state transition and application of the RF values during the following state transition. The application of the RF values to the following state transition helps minimize power reflected towards the RF generator and improves efficiency in processing a wafer. Moreover, the model system is used to determine the RF values. The use of the model system enhances speed of determination of the RF values compared to use of the plasma system.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe systems and methods for reducing reflected power during state transitions by using radio frequency (RF) values. It will be apparent that the present embodiments may be practiced without some or all of these specific details. In other instances, well known process operations have not been described in detail in order not to unnecessarily obscure the present embodiments.

Figure 1:
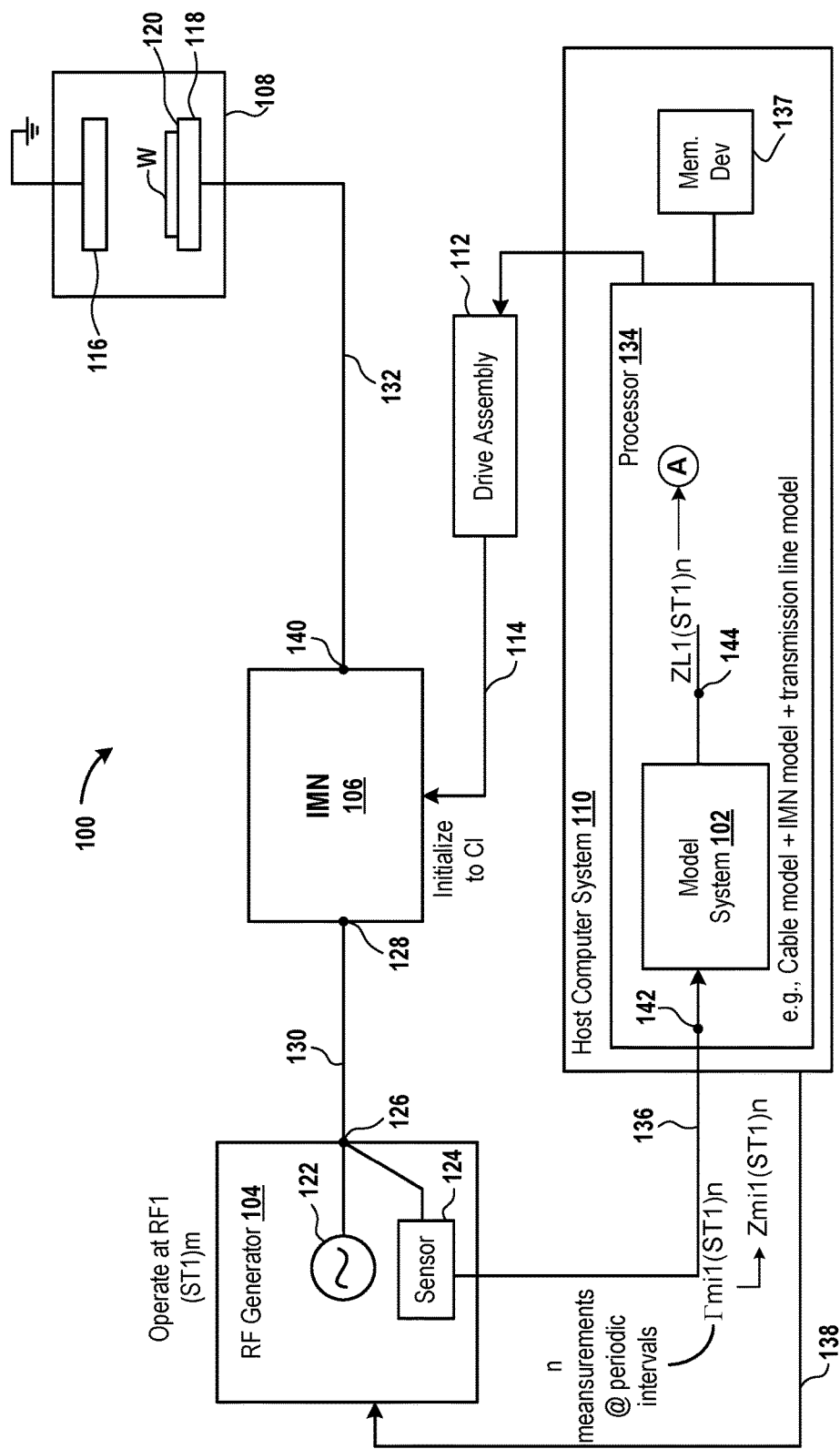
FIG. 1 is a diagram of an embodiment of a plasma system to illustrate generation of a plurality of load impedances ZL1(ST1)n using a model system for a state transition ST1.

FIG. 1 is a diagram of an embodiment of a plasma system 100 to illustrate generation of a plurality of load impedances ZL1(ST1)n using a model system 102 for a state transition ST1. The plasma system 100 includes a radio frequency (RF) generator 104, an impedance matching network 106, and a plasma chamber 108. The plasma system 100 includes a host computer system 110, a drive assembly 112, and one or more connection mechanisms 114.

The plasma chamber 108 includes an upper electrode 116, a chuck 118, and a wafer W. The upper electrode 116 faces the chuck 118 and is grounded, e.g., coupled to a reference voltage, coupled to zero voltage, coupled to a negative voltage, etc. Examples of the chuck 118 include an electrostatic chuck (ESC) and a magnetic chuck. A lower electrode of the chuck 118 is made of a metal, e.g., anodized aluminum, alloy of aluminum, etc. In various embodiments, the lower electrode of the chuck 118 is a thin layer of metal that is covered by a layer of ceramic. Also, the upper electrode 116 is made of a metal, e.g., aluminum, alloy of aluminum, etc. In some embodiments, the upper electrode 116 is made from silicon. The upper electrode 116 is located opposite to and facing the lower electrode of the chuck 118. The wafer W is placed on a top surface 120 of the chuck 118 for processing, e.g., depositing materials on the wafer W, or cleaning the wafer W, or etching layers deposited on the wafer W, or doping the wafer W, or implantation of ions on the wafer W, or creating a photolithographic pattern on the wafer W, or etching the wafer W, or sputtering the wafer W, or a combination thereof.

In some embodiments, the plasma chamber 108 is formed using additional parts, e.g., an upper electrode extension that surrounds the upper electrode 116, a lower electrode extension that surrounds the lower electrode of the chuck 118, a dielectric ring between the upper electrode 116 and the upper electrode extension, a dielectric ring between the lower electrode and the lower electrode extension, confinement rings located at edges of the upper electrode 116 and the chuck 118 to surround a region within the plasma chamber 108 in which plasma is formed, etc.

The impedance matching network 106 includes one or more circuit components, e.g., one or more inductors, or one or more capacitors, or one or more resistors, or a combination or two or more thereof, etc., which are coupled with each other. For example, the impedance matching network 106 includes a series circuit that includes an inductor coupled in series with a capacitor. The impedance matching network 106 further includes a shunt circuit connected to the series circuit. The shunt circuit includes a capacitor connected in series with an inductor. The impedance matching network 106 includes one or more capacitors and corresponding capacitances of the one or more capacitors, e.g., all variable capacitors, etc., are variable, e.g., are varied using a drive assembly, etc. The impedance matching network 106 includes one or more capacitors that have fixed capacitances, e.g., which cannot be changed using the drive assembly 112, etc. A combined variable capacitance of the one or more variable capacitors of the impedance matching network 106 is a value C1. For example, corresponding oppositely-located plates of the one or more variable capacitors are adjusted to be at a fixed position to set the variable capacitance C1. An example of an impedance matching network 106 is provided in the patent application having application Ser. No. 14/245,803.

In various embodiments, each matching network model, e.g., one each for the x MHz RF generator, the y MHz RF generator, and the z MHz RF generator, is generated to operate in a narrow band of frequencies. As an example, the 60 MHz RF generator operates in the narrow band, e.g., between 57 and 63 MHz, etc. While in some embodiments, many circuit elements are used to accurately model the branch circuit of the impedance matching network 106 that operates within a pre-determined range, e.g., from direct current (DC) power to 200 MHz, in several embodiments, a simplified version that models an operation of the branch circuit in a narrower range, e.g., within a pre-determined percentage range from a frequency centered on 60 MHz, etc., is used. An example of the pre-determined percentage range is +/−5% from 60 MHz. Another example of the pre-determined percentage range is +/−4% from 60 MHz. The simplified version has a lesser number of circuit elements that a number of circuit components of the impedance matching network.

In some embodiments, the model system 102 includes a computer-generated model of the impedance matching network 106. For example, the model system 102 is generated by a processor 134 of the host computer system 110. The match network model is derived from e.g., represents, etc., a branch of the impedance matching network 106. For example, when an x megahertz (MHz) RF generator is connected to the branch circuit of the impedance matching network 106, the match network model represents, e.g., is a computer-generated model of, etc., the circuit of the branch circuit of the impedance matching network 106. As another example, the match network model does not have the same number of circuit components as that of the impedance matching network 106.

In some embodiments, the match network model has a lower number of circuit elements than a number of circuit components of the impedance matching network 106. To illustrate, the match network model is a simplified form of the branch circuit of the impedance matching network 106. To further illustrate, variable capacitances of multiple variable capacitors of the branch circuit of the impedance matching network 106 are combined into a combined variable capacitance represented by one or more variable capacitive elements of the match network model, fixed capacitances of multiple fixed capacitors of the branch circuit of the impedance matching network 106 are combined into a combined fixed capacitance represented by one or more fixed capacitive elements of the match network model, and/or inductances of multiple fixed inductors of the branch circuit of the impedance matching network 106 are combined into a combined inductance represented by one or more inductive elements of the match network model, and/or resistances of multiple resistors of the branch circuit of the impedance matching network 106 are combined into a fixed resistance represented by one or more of resistive elements of the match network model. To illustrate more, capacitances of capacitors that are in series are combined by inverting each of the capacitances to generate multiple inverted capacitances, summing the inverted capacitances to generate an inverted combined capacitance, and by inverting the inverted combined capacitance to generate a combined capacitance. As another illustration, multiple inductances of inductors that are connected in series are summed to generate a combined inductance and multiple resistances of resistors that are in series are combined to generate a combined resistance. All fixed capacitances of all fixed capacitors of the branch circuit of the impedance matching network 106 are combined into a combined fixed capacitance of one or more fixed capacitive elements of the match network model. Other examples of the match network model are provided in the patent application having application Ser. No. 14/245,803. Also, a manner of generating a match network model from an impedance matching network is described in the patent application having application Ser. No. 14/245,803.

In some embodiments, the match network model is generated from a schematic for the impedance matching network 106 that has three branches, one each for x MHz, y MHz, and z MHz RF generators. The three branches join each other at an output 140 of the impedance matching network 106. The schematic initially includes a number of inductors and capacitors in various combinations. For one of the three branches considered individually, the match network model represents one of the three branches. Circuit elements are added to the match network model via an input device, examples of which are provided below. Examples of circuit elements added include resistors, not previously included in the schematic, to account for power losses in the branch of the impedance matching network 106, include inductors, not previously included in the schematic, to represent an inductance of various connecting RF straps, and include capacitors, not previously included in the schematic, to represent parasitic capacitances. Moreover, some circuit elements are further added to the schematic via the input device to represent a transmission line nature of the branch of the impedance matching network 106 because of physical dimensions of the impedance matching network 106. For example, an uncoiled length of one or more inductors in the branch of the impedance matching network 106 is not negligible compared to a wavelength of an RF signal passing via the one or more inductors. To account for this effect, an inductor in the schematic is divided into 2 or more inductors. Thereafter, some circuit elements are removed via the input device from the schematic to generate the match network model.

In various embodiments, the match network model has the same topology, e.g., connections between circuit elements, number of circuit elements, etc., as that of the branch circuit of the impedance matching network 106. For example, if the branch circuit of the impedance matching network 106 includes a capacitor coupled in series with an inductor, the match network model includes a capacitor coupled in series with an inductor. In this example, the inductors of the branch circuit of the impedance matching network 106 and of the match network model have the same value and the capacitors of the branch circuit of the impedance matching network 106 and of the match network model have the same value. As another example, if the branch circuit of the impedance matching network 106 includes a capacitor coupled in parallel with an inductor, the match network model includes a capacitor coupled in parallel with an inductor. In this example, the inductors of the branch circuit of the impedance matching network 106 and of the match network model have the same value and the capacitors of the branch circuit of the impedance matching network 106 and of the model system 102 have the same value. As another example, the match network model has the same number and same types of circuit elements as that of circuit components of the impedance matching network 106 and has the same type of connections between the circuit elements as that between the circuit components. Examples of types of circuit elements include resistors, inductors, and capacitors. Examples of type of connections include serial, parallel, etc.

In various embodiments, the model system 102 includes a combination of the match network model and an RF transmission model. An input of the match network model is the input 142. The RF transmission model is connected in series to an output of the match network model and has the output 144. The RF transmission model is derived from the RF transmission line 132 in a similar manner in which the match network model is derived from the impedance matching network 106. For example, the RF transmission model has inductances, capacitances, and/or resistances that are derived from inductances, capacitances, and/or resistances of the RF transmission line 132. As another example, a capacitance of the RF transmission model matches a capacitance of the RF transmission line 132, an inductance of the RF transmission model matches an inductance of the RF transmission line 132, and a resistance of RF transmission model matches a resistance of the RF transmission line 132.

In some embodiments, the model system 102 includes a combination of an RF cable model, the match network model, and the RF transmission model. An input of the RF cable model is the input 142. An output of the RF cable model is connected to an input of the match network model and an output of the match network model is connected to an input of the RF transmission model. The RF transmission model has the output 144. The RF cable model is derived from the RF cable 130 in a similar manner in which the match network model is derived from the impedance matching network 106. For example, the RF cable model has inductances, capacitances, and/or resistances that are derived from inductances, capacitances, and/or resistances of the RF cable 130. As another example, a capacitance of the RF cable model matches a capacitance of the RF cable 130, an inductance of the RF cable model matches an inductance of the RF cable 130, and a resistance of RF cable model matches a resistance of the RF cable 130.

Moreover, the RF generator 104 includes an RF power supply 122 for generating the RF signal. The RF generator 104 includes a sensor 124, e.g., a complex impedance sensor, a complex current and voltage sensor, a complex reflection coefficient sensor, a complex voltage sensor, a complex current sensor, etc., that is connected to an output 126 of the RF generator 104. The output 126 is connected to an input 128 of the branch circuit of the impedance matching network 106 via an RF cable 130. The impedance matching network 106 is connected to the plasma chamber 108 via an RF transmission line 132, which includes an RF rod and an RF outer conductor that surrounds the RF rod.

The drive assembly 112 includes a driver, e.g., one or more transistors, etc., and a motor, and the motor is connected via the connection mechanism 114 to a variable capacitor of the impedance matching network 106. Examples of the connection mechanism 114 include one or more rods, or rods that are connected to each other via a gear, etc. The connection mechanism 114 is connected to a variable capacitor of the impedance matching network 106. For example, the connection mechanism 114 is connected to a variable capacitor that is a part of the branch circuit that is connected to the RF generator 104 via the input 128.

It should be noted that in case the impedance matching network 106 includes more than one variable capacitor in the branch circuit that is connected to the RF generator 104, the drive assembly 112 includes separate motors for controlling the more than one variable capacitor, and each of the motors is connected via a corresponding connection mechanism to the corresponding variable capacitor. In this case, the multiple connection mechanisms are referred to as the connection mechanism 114.

The RF generator 106 is the x MHz RF generator or the y MHz RF generator or the z MHz RF generator. In some embodiments, an example of the x MHz RF generator includes a 2 MHz RF generator, an example of the y MHz RF generator includes a 27 MHz RF generator, and an example of the z MHz RF generator includes a 60 MHz RF generator. In various embodiments, an example of the x MHz RF generator includes a 400 kHz RF generator, an example of the y MHz RF generator includes a 27 MHz RF generator, and an example of the z MHz RF generator includes a 60 MHz RF generator.

It should be noted that in case two RF generators, e.g., the x and y MHz RF generators, etc., are used in the plasma chamber 108, one of the two RF generators is connected to the input 128 and another one of the RF generators is connected to another input of the impedance matching network 106. Similarly, in case three RF generators, e.g., the x, y, and z MHz RF generators, etc., are used in the plasma chamber 108, one of the RF generators is connected to the input 128, a second one of the RF generators is connected to a second input of the impedance matching network 106, and a third one of the RF generators is connected to a third input of the impedance matching network 106. The output 140 is connected to the input 128 via the branch circuit of the impedance matching network 106. In the embodiments in which the three RF generators are used, the output 140 is connected to the second input via a second circuit branch of the impedance matching network 106 and the output 140 is connected to the third input via a third circuit branch of the impedance matching network 106.

The host computer system 110 includes the processor 134 and a memory device 137. The memory device 137 stores the model system 102. The model system 102 is accessed from the memory device 137 for execution by the processor 134. Examples of the host computer 110 include a laptop computer or a desktop computer or a tablet or a smart phone, etc. As used herein, instead of the processor, a central processing unit (CPU), a controller, an application specific integrated circuit (ASIC), or a programmable logic device (PLD) is used, and these terms are used interchangeably herein. Examples of a memory device include a read-only memory (ROM), a random access memory (RAM), a hard disk, a volatile memory, a non-volatile memory, a redundant array of storage disks, a Flash memory, etc. The sensor 124 is connected to the host computer system 110 via a network cable 136. Examples of a network cable, as used herein, is a cable used to transfer data in a serial manner, or in a parallel manner, or using a Universal Serial Bus (USB) protocol, etc.

During the state transition ST1, the RF generator 104 is operated at a plurality of radio frequency values RF1(ST1)m during the transition ST1 from a state S1 to a state S2, where m is an integer greater than zero. Examples of the radio frequency values RF1(ST1)m include RF1(ST1)1, RF1(ST1)2, RF1(ST1)3, etc. For example, the processor 134 provides a recipe that includes the radio frequency values RF1(ST1)m and a plurality of power levels for the state transition ST1 to the RF generator 104. Examples of a state transition include a transition from a first state, e.g., S1, etc., to a second state, e.g., S2, etc. The state S1 has a greater power level than the state S2. For example, the state S1 has a power envelope of an RF signal generated by the RF generator 104 and power values of the power envelope are greater than power values of a power envelope of the RF signal during the state S2. The RF generator 104 operates between the states S1 and S2. During the state S1, the RF signal has a power level, e.g., one or more power amounts, a root mean square power amount of the one or more power amounts, etc., that is greater than a power level of the RF signal during the state S2. Similarly, in some embodiments, during the state S1, the RF signal has a frequency level, one or more frequency amounts, a root mean square frequency amount of the one or more frequency amounts, etc., that is greater or less than a frequency level of the RF signal during the state S2. In some embodiments, the state S1 is referred to herein as a high state and the state S2 is referred to herein as a low state.

In some embodiments, during the state S2, the RF signal has a power level that is greater than a power level of the RF signal during the state S1. Similarly, in these embodiments, during the state S2, the RF signal has a frequency level, e.g., one or more frequency amounts, a root mean square frequency amount of the one or more frequency amounts, a frequency level of an envelope of the RF signal, etc., that is greater than or less than a frequency level of the RF signal during the state S1. In these embodiments, the state S1 is referred to herein as a low state and the state S2 is referred to herein as a high state.

In various embodiments, during the state S2, the RF signal has a power level that is equal to a power level of the RF signal during the state S1.

In some embodiments in which multiple RF generators are used, the state S1 of an RF signal generated by a first one of the RF generators has a power level higher than the state S2 of the RF signal generated by the first RF generator. Moreover, the state S2 of an RF signal generated by a second one of the RF generators has a power level higher than the state S1 of the RF signal generated by the second RF generator. Moreover, similarly, in these embodiments, the state S1 of an RF signal generated by the first RF generator has a frequency level higher than or lower than the state S2 of the RF signal generated by the first RF generator. Moreover, the state S2 of an RF signal generated by the second RF generator has a frequency level higher than or lower than the state S1 of the RF signal generated by the second RF generator.

In various embodiments, regardless of whether a power level of the RF signal during the state S2 is greater than or lower than a power level of the RF signal during the state S1, a frequency level of the RF signal during the state S2 is greater than or lower than a frequency level of the RF signal during the state S1.

In some embodiments, a level, e.g., a frequency level, a power level, etc., as used herein includes one or more values, and a level of a first state, e.g., the state S1, the state S2, etc., has values exclusive of values of a level of a second state, e.g., the state S1, the state S2, etc., that is different from the first state. For example, none of power values of an RF signal during the state S1 are the same as power values of the RF signal during the state S2. As another example, none of frequency values of an RF signal during the state S1 are the same as frequency values of the RF signal during the state S2.

In several embodiments, a state transition refers to a transition between two frequency levels of the RF signal. For example, the state transition ST1 is a transition from one frequency level of the state S1 of the RF signal to another frequency level of the state S2 of the RF signal. As another example, the state transition ST2 is a transition from the other frequency level of the state S2 of the RF signal to the frequency level of the state S1 of the RF signal.

In various embodiments, the RF generator 104 receives a clock signal from the processor 134 or from a clock source, e.g., an oscillator, etc., within the host computer system 110 and alternates between the states S1 and S2 in synchronization with the clock signal. To illustrate, when the clock signal pulses is high, the RF generator 104 generates the RF signal having the state S1 and when the clock signal is low, the RF generator 104 generates the RF signal having the state S2. When the clock signal pulses from high to low, the RF signal pulses from the state S1 to the state S2 and is transitioning via the state transition ST1 from the state S1 to the state S2. When the clock signal pulses from low to high, the RF signal pulses from the state S2 to the state S1 and is transitioning via a state transition ST2 from the state S2 to the state S1. The RF generator 104 receives the recipe via a network cable 138 that is connected to the RF generator 104 and the host computer system 110, and a digital signal processor (DSP) of the RF generator 104 provides the recipe to the RF power supply 122. The RF power supply 122 generates the RF signal that has the radio frequency values RF1(ST1)m and the power levels prescribed in the recipe.

The impedance matching network 106 is initialized to have the combined variable capacitance C1. For example, the processor 134 sends a signal to the driver of the drive assembly 112 to generate one or more current signals. The one or more current signals are generate by the driver and sent to corresponding one or more stators of corresponding one or more motors of the drive assembly 112. One or more rotors of the drive assembly 112 that are in electrical field contact with the corresponding one or more stators rotate to move the connection mechanism 114 to change the combined variable capacitance of the branch circuit of the impedance matching network 106 to C1. The branch circuit of the impedance matching network 106 having the combined variable capacitance C1 receives the RF signal having the radio frequency values RF1(ST1)m from the output 126 via the input 128 and the RF cable 130 and matches an impedance of the load connected to the impedance matching network 106 with that of a source connected to the impedance matching network 106 to generate a modified signal, which is an RF signal. Examples of the load include the plasma chamber 108 and the RF transmission line 132. Examples of the source include the RF cable 130 and the RF generator 104. The modified signal is provided from the output 140 of the branch circuit of the impedance matching network 106 via the RF transmission line 132 to the chuck 118. When the modified signal is provided to the chuck 118 in conjunction with one or more process gases, e.g., oxygen containing gas, fluorine containing gas, etc., plasma is produced or is maintained in a gap between the chuck 118 and the upper electrode 116.

When the RF signal having the radio frequency RF1 (ST1)m is generated and the impedance matching network 106 has the combined variable capacitance C1, the sensor 124 senses a plurality of voltage reflection coefficients $\Gamma mi1(ST1)n$ at the output 126 and provides the voltage reflection coefficients $\Gamma mi1(ST1)n$ via the network cable 136 to the processor 134, where n is an integer greater than zero. For example, during the state transition ST1, the sensor 124 measures the voltage reflection coefficients $\Gamma mi1(ST1)n$ at pre-determined periodic time intervals, e.g., every few microseconds, every 5 microseconds, every 10 microseconds, etc., where n is the number of time intervals and is the same as the number of voltage reflection coefficients $\Gamma mi1 (ST1)n$. To further illustrate, the sensor 124 measures, during the state transition ST1, the voltage reflection coefficient $\Gamma mi1(ST1)1$ at 4 microseconds from an end of the state S1 and measures the voltage reflection coefficient $\Gamma mi1(ST1)2$ at 8 microseconds from the end of the state S1. An example of a voltage reflection coefficient includes a ratio of a voltage reflected towards the RF generator 104 from the plasma chamber 108 and voltage supplied within the RF signal generated by the RF generator 104.

The processor 134 calculates a plurality of impedances $Zmi1(ST1)n$ from the voltage reflection coefficients $\Gamma mi1 (ST1)n$. For example, the processor 134 calculates an impedance $Zmi1(ST1)1$ by applying an equation (1), which is $\Gamma mi1(ST1)1=(Zmi1(ST1)1-Zo)/(Zmi1(ST1)1+Zo)$, and solving for $Zmi1(ST1)1$, where Zo is a characteristic impedance of the RF transmission line 132. As another example, the processor 134 calculates an impedance $Zmi1(ST1)2$ by applying an equation (2), which is $\Gamma mi1(ST1)2=(Zmi1(ST1)2-Zo)/(Zmi1(ST1)2+Zo)$, and solving for $Zmi1(ST1)2$. The impedance Zo is provided to the processor 134 via the input device, e.g., a mouse, a keyboard, a stylus, a keypad, a button, a touch screen, etc., that is connected to the processor 134 via an input/output interface, e.g., a serial interface, a parallel interface, a USB interface, etc. In some embodiments, the sensor 124 measures the impedances $Zmi1(ST1)n$ and provides the impedances $Zmi1(ST1)n$ via the network cable 136 to the processor 134.

The impedances $Zmi1(ST1)n$ are applied by the processor 134 to an input 142 of the model system 102 and are forward propagated via the model system 102 to calculate a plurality of load impedances $ZL1(ST1)n$ at an output 144 of the model system 102. The model system 102 is initialized by the processor 134 to have the combined variable capacitance C1 and the plurality of radio frequency values RF1(ST1)m. For example, the impedance $Zmi1(ST1)1$ is forward propagated by the processor 134 via one or more circuit elements of the model system 102 to generate the load impedance $ZL1(ST1)1$. To illustrate, the model system 102 is initialized to have the radio frequency RF1(ST1)1 and the combined variable capacitance C1. When the model system 102 includes a series combination of a resistive element, an inductive element, a fixed capacitive element, and a variable capacitive element, the processor 134 calculates a directional sum of the impedance Zmi1(ST1)1 received at the input 142 of the model system 102, a complex impedance across the resistive element, a complex impedance across the inductive element, and a complex impedance across the variable capacitive element having the variable capacitance C1, and a complex impedance across the fixed capacitive element to generate the load impedance ZL1(ST1)1. As another example, the impedance Zmi1(ST1)2 is forward propagated by the processor 134 via one or more circuit elements of the model system 102 to generate the load impedance ZL1(ST1)2. To illustrate, the model system 102 is initialized to have the radio frequency RF1(ST1)2 and the combined variable capacitance C1. When the model system 102 includes a series combination of a resistive element, an inductive element, a fixed capacitive element, and a variable capacitive element, the processor 134 calculates a directional sum of the impedance Zmi1(ST1)2 received at the input 142 of the model system 102, a complex impedance across the resistive element, a complex impedance across the inductive element, and a complex impedance across the variable capacitive element having the variable capacitance C1, and a complex impedance across the fixed capacitive element to generate the load impedance ZL1(ST1)2.

In various embodiments, instead of measuring a voltage reflection coefficient at the output 126, a voltage reflection coefficient is measured at any point, on the RF cable 130, from and including the output 126 to the input 128. For example, the sensor 124 is connected to the point between RF power supply 122 and the impedance matching network 106 to measure a voltage reflection coefficient.

In some embodiments, the state transition ST1 is a referred to herein as a type of state transition and the state transition ST2 is referred to herein as a type of state transition.

In some embodiments, each of the measured voltage reflection coefficients Γmi1(ST1)n is weighted by the processor 134 according to a pre-assigned weight. The weights applied by the processor 134 to the voltage reflection coefficients Γmi1(ST1)n are received as inputs via the input device by the processor 134 and are determined based on engineering knowledge and/or process conditions. Instead of applying the voltage reflection coefficients Γmi1(ST1)n, weighted voltage reflection coefficients wΓmi1(ST1)n are applied to determine the load impedances ZL1(ST1)n, where w represents the weights.

Examples of the process conditions include various frequency values of operation of the RF generator 104, or the gap between the upper electrode 116 and the chuck 118, or temperature within the plasma chamber 108, or pressure within the plasma chamber 108, or power values of the RF signal that is generated by the RF generator 104, chemistries of gases within the plasma chamber 108, or a combination of two or more thereof. To illustrate, a process condition 1 includes a frequency value frq1 of the RF signal that is generated by the RF generator 104, a power value pwr1 of the RF signal that is generated by the RF generator 104, a temperature tmp1 within the plasma chamber 108, a pressure pr1 within the plasma chamber 108, the gap of gp1 millimeters (mm), and a chemistry of two process gases. A process condition 2 includes a frequency value frq2 of the RF signal that is generated by the RF generator 104, a power value pwr2 of the RF signal that is generated by the RF generator 104, a temperature tmp1 within the plasma chamber 108, a pressure pr1 within the plasma chamber 108, the gap of gp1 mm, and a chemistry of two process gases.

Figure 2:
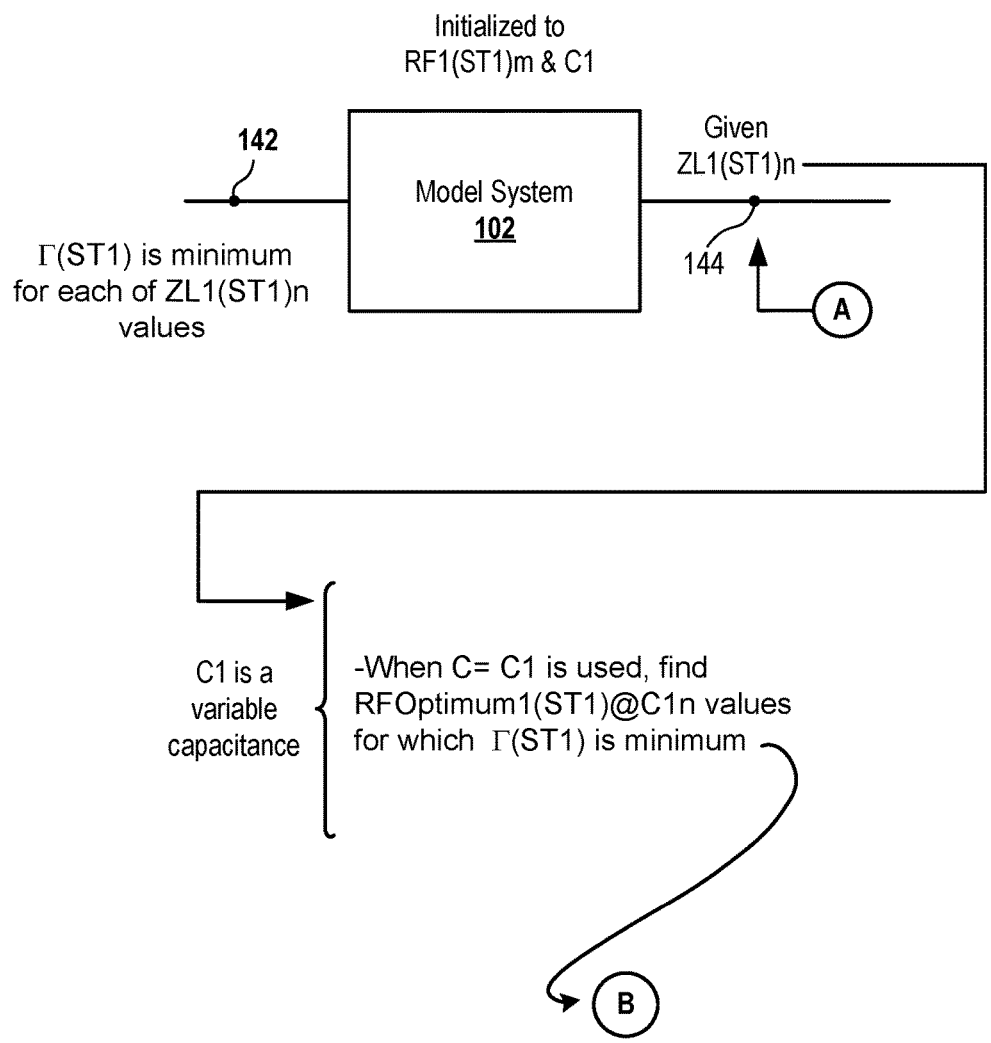
FIG. 2 is a diagram of an embodiment of the model system that is initialized to have multiple radio frequency values RF1(ST1)m and a variable capacitance C1 to determine a plurality of radio frequency values RFoptimum1(ST1)@C1n.

FIG. 2 is a diagram of an embodiment of the model system 102 that is initialized to have the radio frequency values RF1(ST1)m and the variable capacitance C1 to determine a plurality of radio frequency values RFoptimum1(ST1)@C1$n$. For each of the radio frequency values RFoptimum1(ST1)@C1$n$, a voltage reflection coefficient Γ(ST1) for the state transition ST1 at the input 142 is minimum. The processor 134 calculates from the load impedances ZL1(ST1)n and the model system 102 a plurality of radio frequency values RFoptimum1(ST1)n. For each of the radio frequency values RFoptimum1(ST1)@C1$n$, the voltage reflection coefficient Γ(ST1) is minimum from among multiple values of the voltage reflection coefficient Γ(ST1). For example, the processor 134 back propagates the load impedance ZL1(ST1)1 via the model system 102, which is initialized to have the radio frequency RF1(ST1)1 and the variable capacitance C1, to determine the radio frequency value RFoptimum1(ST1)@C11 that generates at the input 142 an input impedance Z1 for the state transition ST1. The processor 134 calculates a voltage reflection coefficient Γ(ST1)1 from the input impedance Z1 in a manner similar to that described above using equation (1). Moreover, the processor 134 back propagates the load impedance ZL1(ST1)1 via the model system 102, which is initialized to have the radio frequency RF1(ST1)1 and the variable capacitance C1, to determine a radio frequency value RFoptimum1(ST1)@C1_1 that generates at the input 142 an input impedance Z2 for the state transition ST1. The processor 134 calculates a voltage reflection coefficient F(ST1)2 from the input impedance Z2 in a manner similar to that described above using equation (1). The processor 134 determines that the voltage reflection coefficient Γ(ST1)1 is less than the voltage reflection coefficient Γ(ST1)2, and determines that the radio frequency value RFoptimum1(ST1)@C11 is one for which the voltage reflection coefficient Γ(ST1)1 is a minimum.

As another example, the processor 134 back propagates the load impedance ZL1(ST1)2 via the model system 102, which is initialized to have the radio frequency RF1(ST1)2 and the variable capacitance C1, to determine the radio frequency value RFoptimum1(ST1)@C12 that generates at the input 142 an input impedance Z3 for the state transition ST1. The processor 134 calculates a voltage reflection coefficient Γ(ST1)3 from the input impedance Z3 in a manner similar to that described above using equation (2). Moreover, the processor 134 back propagates the load impedance ZL1(ST1)2 via the model system 102, which is initialized to have the radio frequency RF1(ST1)2 and the variable capacitance C1, to determine a radio frequency value RFoptimum1(ST1)@C1_2 that generates at the input 142 an input impedance Z4 for the state transition ST1. The processor 134 calculates a voltage reflection coefficient F(ST1)4 from the input impedance Z4 in a manner similar to that described above using equation (2). The processor 134 determines that the voltage reflection coefficient Γ(ST1)3 is less than the voltage reflection coefficient Γ(ST1)4, and determines that the radio frequency value RFoptimum1(ST1)@C12 is one for which the voltage reflection coefficient Γ(ST1)3 is a minimum.

It should be noted that the value ZL1(ST1)1 is determined from the load value Zmi1(ST1)1, which is measured at an end of a first time period, e.g., t1, etc., from an end of the state S1. The value ZL1(ST1)2 is determined from the load value Zmi1(ST1)2, which is measured at an end of a second time period, e.g., t2, etc., from the time period t1 from the end of the state S1. In some embodiments, the second time period during a state transition is consecutive to the first time period t1 from the state S1 and is equal in length to the first time period during the state transition. In various embodiments, the voltage reflection coefficient Γ(ST1)1 is a minimum among all voltage reflection coefficients for the first time period and the voltage reflection coefficient Γ(ST1)2 is a minimum among all voltage reflection coefficients for the second time period.

In some embodiments, a non-linear least squares optimization routine is executed by the processor 134 to solve for and calculate from the load impedance ZL1(ST1)n and the model system 102 the radio frequency values RFoptimum1(ST1)@C1n. For each of the radio frequency values RFoptimum1(ST1)@C1n, the voltage reflection coefficient Γ(ST1) for the state transition ST1 is minimum. In various embodiments, pre-determined equations are applied by the processor 134 to solve for and calculate from the load impedance ZL1(ST1)n and the model system 102 the radio frequency values RFoptimum1(ST1)@C1n.

In various embodiments, a value of a radio frequency of the model system 102 for which a voltage reflection coefficient Γ at the input 142 is a minimum is referred to herein as a favorable RF value.

In some embodiments, an RF value is sometimes referred to herein as a "parametric value". Moreover, a capacitance is sometimes referred to herein as a "measurable factor".

Figure 3:
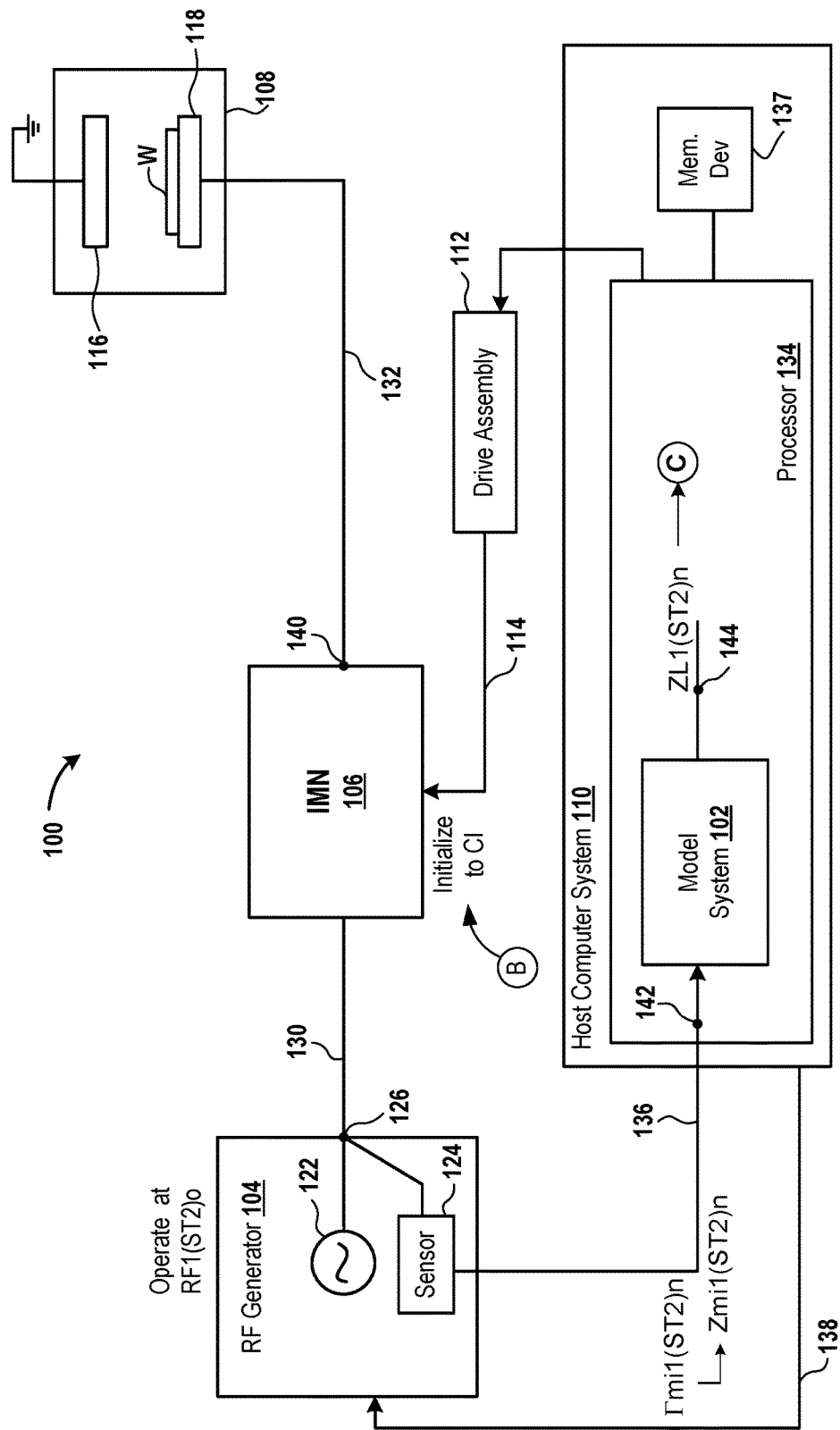
FIG. 3 is a diagram of an embodiment of the plasma system to illustrate generation of a plurality of load impedances ZL1(ST2)n using the model system 102 for a state transition ST2.

FIG. 3 is a diagram of an embodiment of the plasma system 100 to illustrate generation of a plurality of load impedances ZL1(ST2)n using the model system 102 for the state transition ST2. The state transition ST2 of the RF signal that is generated by the RF generator 104 is from the state S2 to the state S1. During the state transition ST2, the RF generator 104 is operated at a plurality of radio frequency values RF1(ST2)o and the wafer W is placed on the top surface 120 for processing, where o is an integer greater than zero. For example, the processor 134 provides a recipe that includes the radio frequency values RF1(ST2)o and a plurality of power levels for the state transition ST2 to the RF generator 104. The RF generator 104 receives the recipe via the network cable 138 that is connected to the RF generator 104 and the host computer system 110, and the DSP of the RF generator 104 provides the recipe to the RF power supply 122. The RF power supply 122 generates the RF signal that has the radio frequency values RF1(ST2)o and the power levels prescribed in the recipe.

The impedance matching network 106 is initialized to have the combined variable capacitance C1. The branch circuit of the impedance matching network 106 having the combined variable capacitance C1 receives the RF signal having the radio frequency radio frequency values RF1(ST2)o from the output 126 via the input 128 and the RF cable 130 and matches an impedance of the load connected to the impedance matching network 106 with that of the source connected to the impedance matching network 106 to generate the modified signal. The modified signal is provided from an output 140 of the branch circuit of the impedance matching network 106 via the RF transmission line 132 to the chuck 118. When the modified signal is provided to the chuck 118 in conjunction with one or more process gases, plasma is produced or is maintained in the gap between the chuck 118 and the upper electrode 116.

During the state transition ST2, when the RF signal having the radio frequency values RF1(ST2)o is generated and the impedance matching network 106 has the combined variable capacitance C1, the sensor 124 senses a plurality of voltage reflection coefficients Γmi1(ST2)n at the output 126 and provides the voltage reflection coefficients via the network cable 136 to the processor 134. Similar to that for the state transition ST1, the voltage reflection coefficients Γmi1(ST2)n are measured, during the state transition ST2, at the periodic time intervals n from an end of the state S2. For example, the voltage reflection coefficient Γmi1(ST2)1 is measured at an end of the first time period t1 from the end of the state S2 and the voltage reflection coefficient Γmi1(ST2)2 is measured at an end of the second time period t2 from the end of the first time period t1 from the end of the state S2. The processor 134 calculates a plurality of impedances Zmi1(ST2)n from the voltage reflection coefficients Γmi1(ST2)n. For example, the processor 134 calculates the impedance Zmi1(S2)1 by applying an equation (3), which is Γmi1(ST2)1=(Zmi1(ST2)1−Zo)/(Zmi1(ST2)1+Zo), and solving for Zmi1(ST2)1. As another example, the processor 134 calculates the impedance Zmi1(ST2)2 by applying an equation (4), which is Γmi1(ST2)2=(Zmi1(ST2)2−Zo)/(Zmi1(ST2)2+Zo), and solving for Zmi1(ST2)2. In some embodiments, the sensor 124 measures the impedances Zmi1(ST2)n and provides the impedances Zmi1(ST2)n via the network cable 136 to the processor 134.

The impedances Zmi1(ST2)n are applied by the processor 134 to the input 142 of the model system 102 and is forward propagated via the model system 102 to calculate a plurality of load impedances ZL1(ST2)n at the output 144 of the model system 102. For example, the model system 102 is initialized to have the radio frequency values RF1(ST2)o and the variable capacitance C1. When the model system 102 includes a series combination of a resistive element, an inductive element, a fixed capacitive element, and a variable capacitive element, the processor 134 calculates a directional sum of the impedance Zmi1(ST2)1 received at the input 142 of the model system 102, a complex impedance across the resistive element, a complex impedance across the inductive element, and a complex impedance across the variable capacitive element having the variable capacitance C1, and a complex impedance across the fixed capacitive element to generate the load impedance ZL1(ST2)1. The processor 134 calculates a directional sum of the impedance Zmi1(ST2)2 received at the input 142 of the model system 102, a complex impedance across the resistive element, a complex impedance across the inductive element, and a complex impedance across the variable capacitive element having the variable capacitance C1, and a complex impedance across the fixed capacitive element to generate the load impedance ZL1(ST2)2.

In some embodiments, each of the measured voltage reflection coefficients Γmi1(ST2)n is weighted by the processor 134 according to a pre-assigned weight. The weights applied by the processor 134 to the voltage reflection coefficients Γmi1(ST2)n are received as inputs via the input device by the processor 134 and are determined based on engineering knowledge and/or the process conditions. Instead of applying the voltage reflection coefficients Γmi1(ST2)n, weighted voltage reflection coefficients wΓmi1(ST2)n are applied to determine the load impedances ZL1(ST2)n, where w represents the weights.

Figure 4:
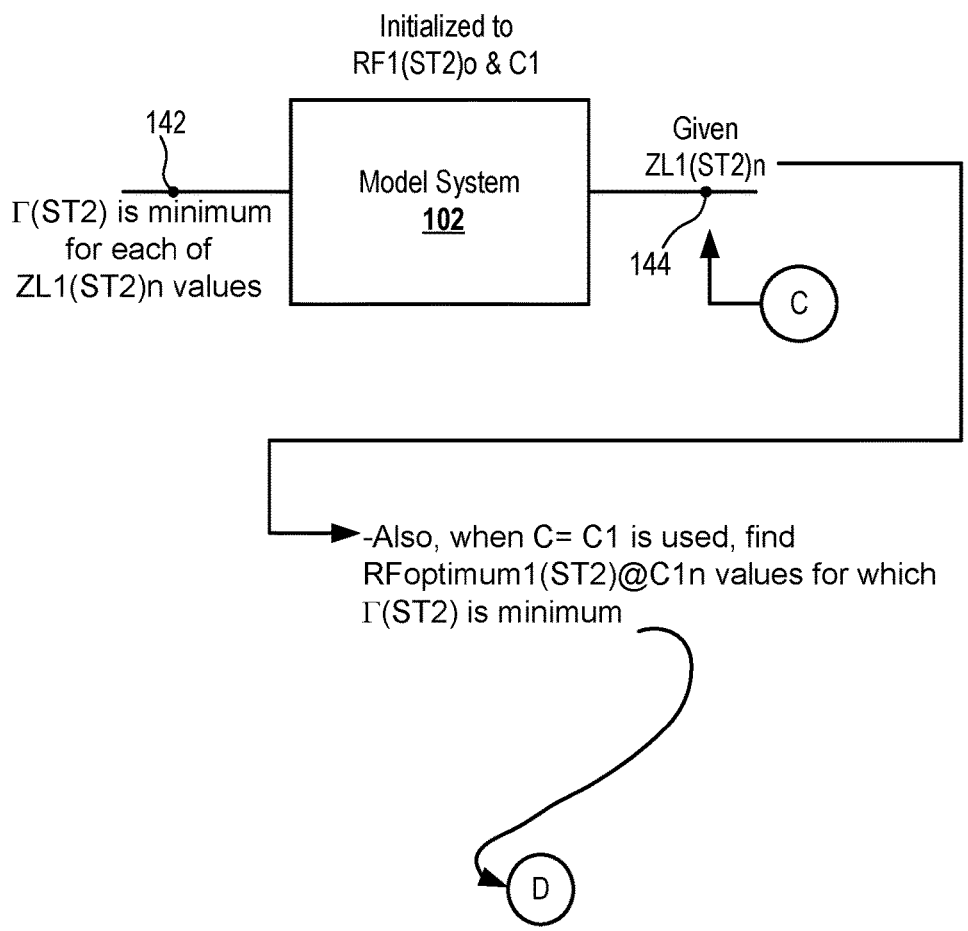
FIG. 4 is a diagram of an embodiment of the model system that is initialized to have multiple radio frequency values RF1(ST2)o and the variable capacitance C1 to determine a plurality of radio frequency values RFoptimum1(ST2)@C1n.

FIG. 4 is a diagram of an embodiment of the model system 102 that is initialized to have the radio frequency values RF1(ST2)o and the variable capacitance C1 to determine a plurality of radio frequency values RFoptimum1(ST2)@C1n. For each of the radio frequency values RFoptimum1(ST2)@C1n, a voltage reflection coefficient Γ(ST2) for the state transition ST2 at the input 142 is minimum from among multiple values of the voltage reflection coefficient Γ(ST2). For example, the processor 134 back propagates the load impedance ZL1(ST2)1 via the model system 102, which is initialized to have the radio frequency RF1(ST2)1 and the variable capacitance C1, to determine the radio frequency value RFoptimum1(ST2)@C11 that generates at the input 142 an input impedance Z5 for the state transition ST2. The processor 134 calculates a voltage reflection coefficient Γ(ST2)5 from the input impedance Z5 in a manner similar to that described above using equation (1). Moreover, the processor 134 back propagates the load impedance ZL1(ST2)1 via the model system 102, which is initialized to have the radio frequency RF1(ST2)1 and the variable capacitance C1, to determine a radio frequency value RFoptimum1(ST2)@C1_1 that generates at the input 142 an input impedance Z6 for the state transition ST2. The processor 134 calculates a voltage reflection coefficient Γ(ST2)6 from the input impedance Z6 in a manner similar to that described above using equation (1). The processor 134 determines that the voltage reflection coefficient Γ(ST2)5 is less than the voltage reflection coefficient Γ(ST2)6, and determines that the radio frequency value RFoptimum1(ST2)@C11 is one for which the voltage reflection coefficient F(ST2)5 is a minimum.

As another example, the processor 134 back propagates the load impedance ZL1(ST2)2 via the model system 102, which is initialized to have the radio frequency RF1(ST2)2 and the variable capacitance C1, to determine the radio frequency value RFoptimum1(ST2)@C12 that generates at the input 142 an input impedance Z7 for the state transition ST2. The processor 134 calculates a voltage reflection coefficient Γ(ST2)7 from the input impedance Z7 in a manner similar to that described above using equation (2). Moreover, the processor 134 back propagates the load impedance ZL1(ST2)2 via the model system 102, which is initialized to have the radio frequency RF1(ST2)2 and the variable capacitance C1, to determine a radio frequency value RFoptimum1(ST2)@C1_2 that generates at the input 142 an input impedance Z8 for the state transition ST2. The processor 134 calculates a voltage reflection coefficient Γ(ST2)8 from the input impedance Z8 in a manner similar to that described above using equation (2). The processor 134 determines that the voltage reflection coefficient Γ(ST2)7 is less than the voltage reflection coefficient Γ(ST2)8, and determines that the radio frequency value RFoptimum1(ST2)@C12 is one for which the voltage reflection coefficient Γ(ST2)7 is a minimum.

It should be noted that the value ZL1(ST2)1 is determined from the load value Zmi1(ST2)1, which is measured at an end of the first time period, e.g., t1, etc., from the end of the state S2. The value ZL1(ST2)2 is determined from the load value Zmi1(ST2)2, which is measured at an end of the second time period, e.g., t2, etc., from the end of the first time period t1 from the end of the state S2. The second time period t2 is consecutive to the first time period t1 from the state S2. The voltage reflection coefficient Γ(ST2)5 is a minimum among all voltage reflection coefficients for the first time period and the voltage reflection coefficient Γ(ST2)7 is a minimum among all voltage reflection coefficients for the second time period.

In some embodiments, a non-linear least squares optimization routine is executed by the processor 134 to solve for and calculate from the load impedances ZL1(ST2)n and the model system 102 the radio frequency values RFoptimum1(ST2)@C1n. For each of the radio frequency values RFoptimum1(ST2)@C1n, the voltage reflection coefficient Γ(ST2) for the state transition ST2 is minimum at the input 142. In various embodiments, pre-determined equations are applied by the processor 134 to solve for and calculate from the load impedances ZL1(ST2)n and the model system 102 the radio frequency values RFoptimum1(ST2)@C1n.

Figure 5:
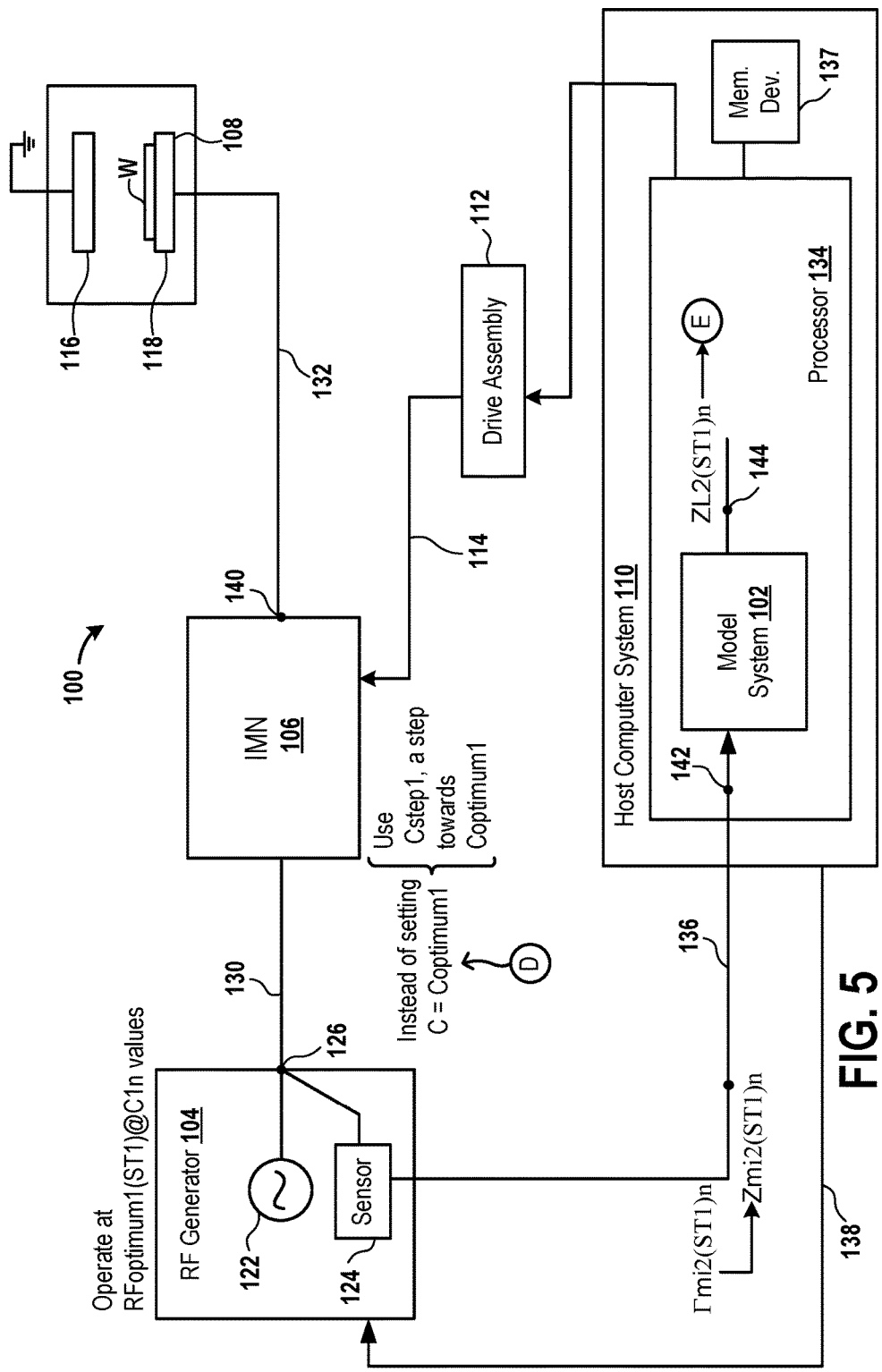
FIG. 5 is a diagram of an embodiment of the plasma system to illustrate use of a capacitance value Coptimum1 to generate a step combined variable capacitance value Cstep1 for the state transition ST1, and to illustrate use of the values RFoptimum1(ST1)@C1n to generate, for the state transition ST1, a plurality of load impedances ZL2(ST1)n at an output of the model system.

FIG. 5 is a diagram of an embodiment of the plasma system 100 to illustrate use of a capacitance value Coptimum1 to generate a step combined variable capacitance value Cstep1 for the state transition ST1, and use of the values RFoptimum1(ST1)@C1n to generate, for the state transition ST1, a plurality of load impedances ZL2(ST1)n at the output 144 of the model system 102. It should be noted that a manner of determining the capacitance value Coptimum1 is described in the U.S. patent application Ser. No. 15/098,189. The processor 134 modifies the recipe during the state transition ST1 to include the radio frequency values RFoptimum1(ST1)@C1n and provides the radio frequency values RFoptimum1(ST1)@C1n to the RF generator 104. Moreover, the processor 134 determines the step variable capacitance value Cstep1 for the state transition ST1. The step variable capacitance value Cstep1 is a step in a direction of the value Coptimum1 from the value C1.

It should be noted that when one or more capacitances of corresponding one or more variable capacitors of the impedance matching network 106 are modified to change from C1 towards Coptimum1, the one or more variable capacitors move slow enough relative to changes in an RF frequency of the RF signal generated by the RF generator 104. Instead of setting the combined variable capacitance of the impedance matching network 106 at the value Coptimum1, the processor 134 controls the drive assembly 112 so that the combined variable capacitance of the impedance matching network 106 is set at the value Cstep1. It takes a longer time, e.g., in an order of seconds, etc., for the impedance matching network 106 to achieve the variable capacitance Coptimum1 than that taken by the RF generator 104 to generate an RF signal having the radio frequency values RFoptimum1(ST1)@C1n. For example, it takes in an order of microseconds for the RF generator 104 to achieve the radio frequency values RFoptimum1(ST1)@C1n from the radio frequencies RF1(ST1)m. As a result, it is difficult to directly achieve the value Coptimum1 from the value C1 simultaneous with achieving the radio frequency values RFoptimum1(ST1)@C1n from the values RF1(ST1)m so that the voltage reflection coefficient Γ(ST1) at the input 126 of the RF generator 104 is a minimum. Therefore, the variable capacitance of the impedance matching network 106 is adjusted in steps, e.g., Cstep1 etc., in a direction towards the variable capacitance Coptimum1 during the state transition ST1. The processor 134 further controls the RF generator 104 to operate at the radio frequency values RFoptimum1(ST1)@C1n during the state transition ST1.

For the radio frequencies RFoptimum1(ST1)@C1n and the variable capacitance Cstep1, the RF generator 104 generates the RF signal having the radio frequency values RFoptimum1(ST1)@C1n, which passes via the impedance matching network 106 to generate the modified signal, which is provided to the lower electrode 118. When the values RFoptimum1(ST1)@C1n are used instead of the values RF1(ST1)m, a lesser amount of power is reflected towards the RF generator 104 during the state transition ST1.

When the RF generator 104 generates the RF signal having the radio frequency values RFoptimum1(ST1)@C1n and the combined variable capacitance is Cstep1, the sensor 124 measures a plurality of voltage reflection coefficients Γmi2(ST1)n at the output 126 and the processor 134 generates a plurality of impedances Zmi2(ST1)n from the voltage reflection coefficients Γmi2(ST1)n in the same manner, described above, in which the impedances Zmi1(ST1)n are generated from the voltage reflection coefficients Γmi1(ST1)n. For example, the processor 134 generates the impedance value Zmi2(ST1)1 from the voltage reflection coefficient Γmi2(ST1)1, which is measured during the first time period t1 of the state transition ST1 from an end of the state S1. Moreover, the processor 134 generates the impedance value Zmi2(ST1)2 from the voltage reflection coefficient Γmi2(ST1)2, which is measured at an end of the second time period t2 of the state transition ST1 from an end of the first time period t1 during the state transition ST1.

Moreover, when the model system 102 is set to have the radio frequency values RFoptimum1(ST1)@C1$n$ for the state transition ST1 and the combined variable capacitance Cstep1 for the state transition ST1, the impedances Zmi2(ST1)n are forward propagated via the model system 102 to generate the load impedances ZL2(ST1)n at the output 144 of the model system 102 in the same manner in which the load impedances ZL1(ST1)n are generated at the output 144 from the impedances Zmi1(ST1)n at the input 142 of the model system 102.

In various embodiments, the combined variable capacitance Cstep1 is closer to the combined variable capacitance Coptimum1 compared to the combined variable capacitance C1. For example, the combined variable capacitance Cstep1 is greater than the combined variable capacitance C1, and the combined variable capacitance Coptimum1 is greater than the combined variable capacitance Cstep1. As another example, the combined variable capacitance Cstep1 is less than the combined variable capacitance C1, and the combined variable capacitance Coptimum1 is less than the combined variable capacitance Cstep1.

In some embodiments, instead of generating an impedance, e.g., the impedances Zmi1(ST1)n, Zmi2(ST1)n, etc., for the state transition ST1 from a voltage reflection coefficient, e.g., Γmi1(ST1)n, Γmi2(ST1)n, etc., received from the sensor 124 for the state transition ST1, the processor 134 receives the voltage reflection coefficient to generate a plurality of corresponding load voltage reflection coefficients, e.g., ΓL1(ST1)n, ΓL2(ST1)n, etc., at the output 144 of the model system 102. The plurality of corresponding load voltage reflection coefficients are applied at the output 144 of the model system 102 in the same manner in which the load impedances, e.g., ZL1(ST1)n, ZL2(ST1)n, etc., for the state transition ST1 are applied at the output of the model system 102. There is no need to convert from a voltage reflection coefficient to impedance and vice versa.

In various embodiments, instead of the voltage reflection coefficient values Γmi1(ST1)n and Γmi2(ST1)n for the state transition ST1, statistical values, e.g., average values, moving average values, etc., of the voltage reflection coefficient values Γmi1(ST1)n and Γmi2(ST1)n are calculated by the processor 134 and provided to the input 142 of the model system for calculation of load impedance values at the output 144 of the model system 102. For example, instead of applying the voltage reflection coefficient values Γmi2(ST1)n to the input 142 of the model system 102, average values determined from the voltage reflection coefficient values Γmi1(ST1)n and Γmi2(ST1)n by the processor 134 are provided as input to the model system 102 to calculate the load impedances ZL2(ST1)n at the output 144 of the model system 102. To further illustrate, a first average value of voltage reflection coefficient values Γmi1(ST1)1 and Γmi2(ST1)1 is determined by the processor 134 and the first average value is forward propagated via the model system 102 to generate the load impedance value ZL2(ST1)1. Moreover, a second average value of voltage reflection coefficient values Γmi1(ST1)2 and Γmi2(ST1)2 is determined by the processor 134 and the second average value is forward propagated via the model system 102 to generate the load impedance value ZL2(ST1)2.

In some embodiments, each of the measured voltage reflection coefficients Γmi2(ST1)n is weighted by the processor 134 according to a pre-assigned weight. The weights applied by the processor 134 to the voltage reflection coefficients Γmi2(ST1)n are received as inputs via the input device by the processor 134 and are determined based on engineering knowledge and/or the process conditions. Instead of applying the voltage reflection coefficients Γmi2(ST1)n, weighted voltage reflection coefficients wΓmi2(ST1)n are applied to determine the load impedances ZL2(ST1)n, where w are the weights.

Figure 6:
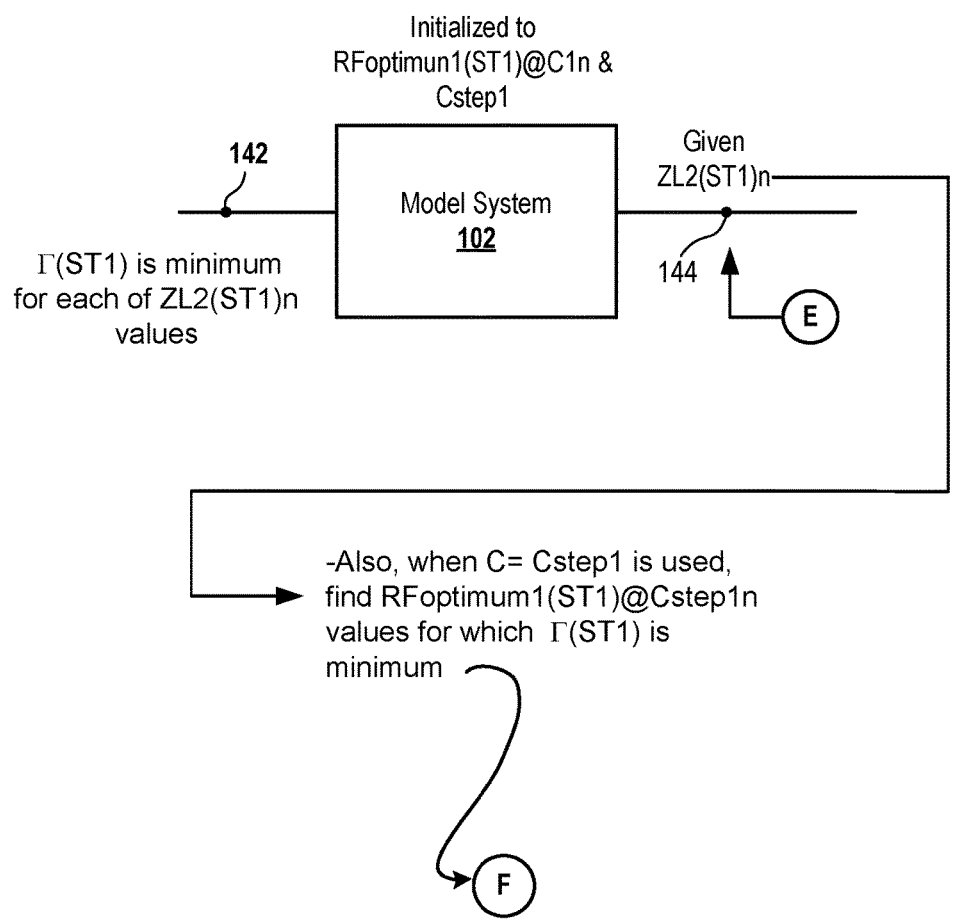
FIG. 6 is a diagram of an embodiment of the model system that is initialized to have the radio frequency values RFoptimum1(ST1)@C1n and the variable capacitance Cstep1 to determine a plurality of radio frequency values RFoptimum1(ST1)@Cstep1n.

FIG. 6 is a diagram of an embodiment of the model system 102 that is initialized to have the radio frequency values RFoptimum1(ST1)@C1$n$ and the variable capacitance Cstep1 to determine a plurality of radio frequency RFoptimum1(ST1)@Cstep1$n$. For each of the radio frequency values RFoptimum1(ST1)@Cstep1$n$, the voltage reflection coefficient Γ(ST1) for the state transition ST1 at the input 142 is minimum. The processor 134 calculates from the load impedances ZL2(ST1)n and the model system 102 the plurality of radio frequency values RFoptimum1(ST1)@Cstepn. For each of the radio frequency values RFoptimum1(ST1)@Cstepn, the voltage reflection coefficient Γ(ST1) is minimum from among multiple values of the voltage reflection coefficient Γ(ST1). For example, the processor 134 back propagates the load impedance ZL2(ST1)1 via the model system 102, which is set to have the radio frequency value RFoptimum1(ST1)@C11 and the variable capacitance Cstep1, to determine a radio frequency value RFoptimum1(ST1)@Cstep11 that generates at the input 142 an input impedance Z9 for the state transition ST1. The processor 134 calculates a voltage reflection coefficient Γ(ST1)9 from the input impedance Z9 in a manner similar to that described above using equation (1). Moreover, the processor 134 back propagates the load impedance ZL2(ST1)1 via the model system 102, which is set to have the radio frequency value RFoptimum1(ST1)@C11 and the variable capacitance Cstep1, to determine a radio frequency value RFoptimum1(ST1)@Cstep1_1 that generates at the input 142 an input impedance Z10 for the state transition ST1. The processor 134 calculates a voltage reflection coefficient Γ(ST1)10 from the input impedance Z10 in a manner similar to that described above using equation (1). The processor 134 determines that the voltage reflection coefficient Γ(ST1)9 is less than the voltage reflection coefficient Γ(ST1)10, and determines that the radio frequency value RFoptimum1(ST1)@Cstep11 is one for which the voltage reflection coefficient Γ(ST1)9 is a minimum.

As another example, the processor 134 back propagates the load impedance ZL2(ST1)2 via the model system 102, which is initialized to have the radio frequency RFoptimum1(ST1)@C12 and the variable capacitance Cstep1, to determine the radio frequency value RFoptimum1(ST1)@Cstep12 that generates at the input 142 an input impedance Z11 for the state transition ST1. The processor 134 calculates a voltage reflection coefficient Γ(ST1)11 from the input impedance Z11 in a manner similar to that described above using equation (2). Moreover, the processor 134 back propagates the load impedance ZL2(ST1)2 via the model system 102, which is initialized to have the radio frequency RFoptimum1(ST1)@C12 and the variable capacitance Cstep1, to determine a radio frequency value RFoptimum1(ST1)@Cstep1_2 that generates at the input 142 an input impedance Z12 for the state transition ST1. The processor 134 calculates a voltage reflection coefficient Γ(ST1)12 from the input impedance Z12 in a manner similar to that described above using equation (2). The processor 134 determines that the voltage reflection coefficient Γ(ST1)11 is less than the voltage reflection coefficient Γ(ST1)12, and determines that the radio frequency value RFoptimum1(ST1)@Cstep12 is one for which the voltage reflection coefficient Γ(ST1)11 is a minimum.

It should be noted that the value ZL2(ST1)1 is determined from the load value Zmi2(ST1)1, which is measured at an end of the first time period, e.g., t1, etc., from an end of the state S1. The value ZL2(ST1)2 is determined from the load value Zmi2(ST1)2, which is measured at an end of a second time period, e.g., t2, etc., from the first time period t1 from the end of the state S1. The second time period from the state S1 is consecutive to the first time period from the state S1. The voltage reflection coefficient Γ(ST1)9 is a minimum among all voltage reflection coefficients for the first time period and the voltage reflection coefficient Γ(ST1)11 is a minimum among all voltage reflection coefficients for the second time period.

In some embodiments, a non-linear least squares optimization routine is executed by the processor 134 to solve for and calculate from the load impedances ZL2(ST1)n and the model system 102 the radio frequency values RFoptimum1(ST1)@Cstep1n. For each of the radio frequency values RFoptimum1(ST1)@Cstep1n, the voltage reflection coefficient Γ(ST1) for the state transition ST1 is minimum. In various embodiments, pre-determined equations are applied by the processor 134 to solve for and calculate from the load impedances ZL2(ST1)n and the model system 102 the radio frequency values RFoptimum1(ST1)@Cstep1n.

In some embodiments, operations described herein with reference to FIGS. 1 and 2 are performed during a first occurrence of the state transition ST1 and operations described herein as with reference to FIG. 5 is during a second occurrence of the state transition ST1. For example, the state transition ST2 that is described with reference to FIGS. 3 and 4 is consecutive to the state transition ST1 described with reference to FIGS. 1 and 2. There is no state transition between the state transition ST1 as is described using FIGS. 1 and 2, and the state transition ST2 as is described using FIGS. 3 and 4. To illustrate, the state transition ST1 described with reference to FIGS. 1 and 2 is immediately followed by the state S2, which is immediately followed by the state transition ST2 described with reference to FIGS. 3 and 4. Moreover, in the example, the state transition ST1 that is described with reference to FIGS. 5 and 6 is consecutive to the state transition ST2 described with reference to FIGS. 3 and 4. There is no state transition between the state transition ST2 as is described using FIGS. 3 and 4, and the state transition ST1 as is described using FIGS. 5 and 6. To illustrate, the state transition ST2 described with reference to FIGS. 3 and 4 is immediately followed by the state S1, which is immediately followed by the state transition ST1 described with reference to FIGS. 5 and 6.

In various embodiments, the second occurrence of the state transition ST1 occurs after one or more intermediate occurrences of the state transition ST1, which occur after the first occurrence of the state transition ST1. For example, the second occurrence of the state transition ST1 that is described with reference to FIGS. 5 and 6 occurs after one or more occurrences of the state transition ST1 and the one or more occurrences occur after the first occurrence of the state transition ST1 that is described with reference to FIGS. 1 and 2.

Figure 7:
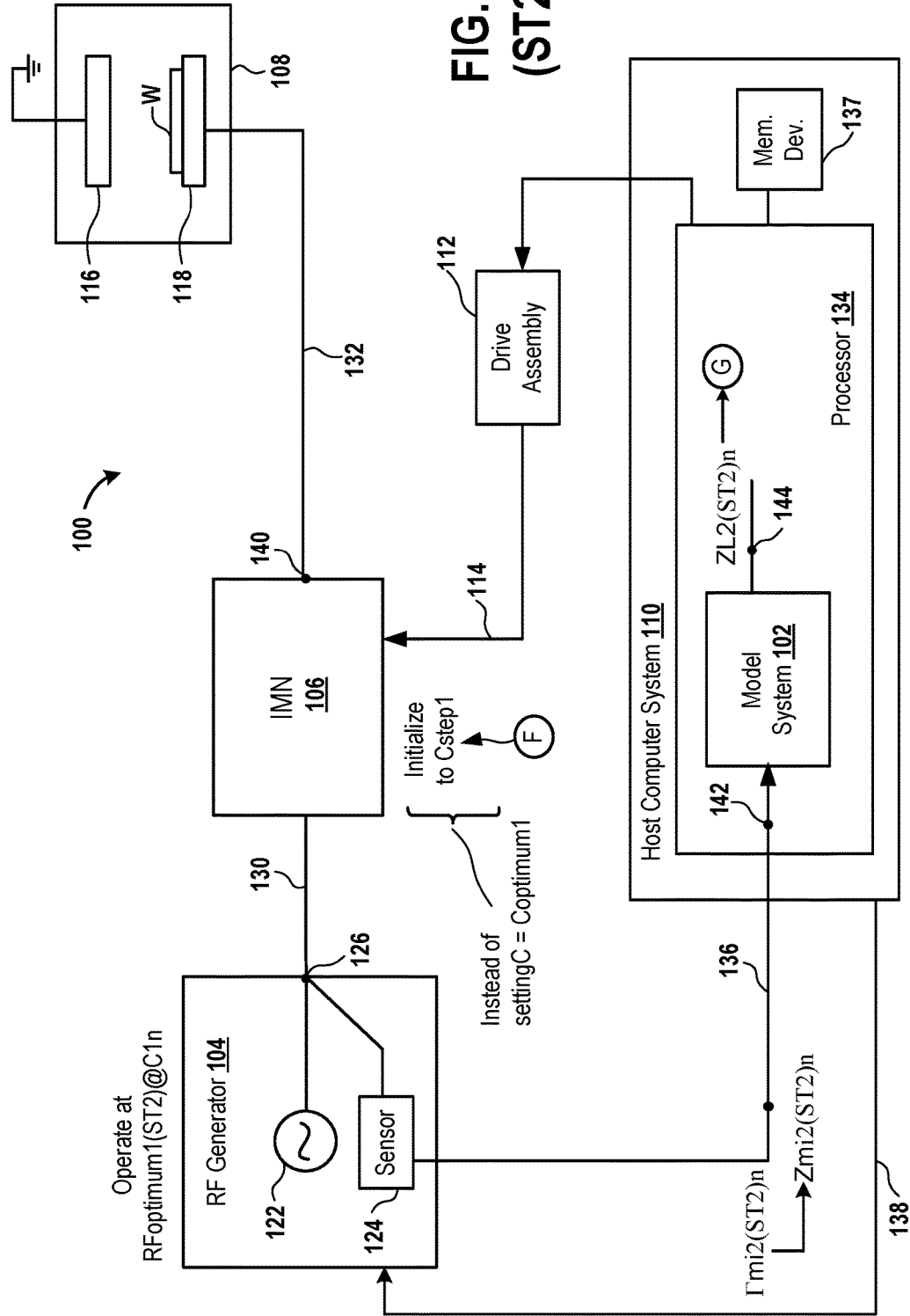
FIG. 7 is a diagram of an embodiment of the plasma system to illustrate, during the state transition ST2, use of the capacitance value Coptimum1 to apply the step combined variable capacitance value Cstep1, and use of the values RFoptimum1(ST2)@C1n to generate a plurality of load impedances ZL2(ST2)n at the output of the model system.

FIG. 7 is a diagram of an embodiment of the plasma system 100 to illustrate, during the state transition ST2 from the state S2 to the state S1, use of the capacitance value Coptimum1 to generate the step combined variable capacitance value Cstep1, and use of the values RFoptimum1(ST2)@C1n to generate a plurality of load impedances ZL2(ST2)n at the output 144 of the model system 102. The processor 134 modifies the recipe to include the radio frequency values RFoptimum1(ST2)@C1n during the state transition ST2, and provides the radio frequency values RFoptimum1(ST2)@C1n to the RF generator 104. Moreover, the processor 134 determines the step variable capacitance value Cstep1 for the state transition ST2.

During the state transition ST2, instead of setting the combined variable capacitance of the impedance matching network 106 at the value Coptimum1, the processor 134 controls the drive assembly 112 so that the combined variable capacitance of the impedance matching network 106 is set at the value Cstep1. Also, the processor 134 controls the RF generator 104 to operate at the radio frequency values RFoptimum1(ST2)@C1n. When the values RFoptimum1(ST2)@C1n are used instead of the values RF1(ST2)o, a lesser amount of power is reflected towards the RF generator 104 during the state transition ST1. It takes a longer time, e.g., in an order of seconds, etc., for the impedance matching network 106 to achieve the variable capacitance Coptimum1 than that taken by the RF generator 104 to generate an RF signal having the radio frequency values RFoptimum1(ST2)@C1n. For example, it takes in an order of microseconds for the RF generator 104 to achieve the radio frequency values RFoptimum1(ST2)@C1n from the radio frequencies RF1(ST2)o. As a result, it is difficult to directly achieve the value Coptimum1 from the value C1 simultaneous with achieving the radio frequency values RFoptimum1(ST2)@C1n from the values RF1(ST2)o so that the voltage reflection coefficient Γ(S2) at the input 126 of the RF generator 104 is a minimum. Therefore, the variable capacitance of the impedance matching network 106 is adjusted in steps, e.g., Cstep1 etc., in a direction towards the variable capacitance Coptimum1 during the state transition ST2.

For the radio frequency values RFoptimum1(ST2)@C1n and the variable capacitance Cstep1, the RF generator 104 generates the RF signal having the radio frequency values RFoptimum1(ST2)@C1n, and the RF signal passes via the impedance matching network 106 to generate the modified signal, which is provided to the lower electrode 118. When the RF generator 104 generates the RF signal having the radio frequency values RFoptimum1(ST2)@C1n and the combined variable capacitance is Cstep1, the sensor 124 measures a plurality of voltage reflection coefficients Γmi2(ST2)n at the output 126 and provides the voltage reflection coefficients Γmi2(ST2)n to the processor 134 via the network cable 136. The processor 134 generates a plurality of impedances Zmi2(ST2)n from the voltage reflection coefficients Γmi2(ST2)n in the same manner, described above, in which the impedances Zmi1(ST2)n are generated from the voltage reflection coefficients Γmi1(ST2)n. Moreover, when the model system 102 is set to have the radio frequency values RFoptimum1(ST2)@C1n and the variable capacitance Cstep1, the impedances Zmi2(ST2)n are forward propagated via the model system 102 to generate a plurality of load impedances ZL2(ST2)n at the output 144 of the model system 102 in the same manner in which the load impedances ZL1(ST2)n are generated at the output 144 from the impedances Zmi1(ST2)n at the input 142 of the model system 102.

In some embodiments, instead of generating an impedance, e.g., the impedances Zmi1(ST2)n, Zmi2(ST2)n, etc., for the state transition ST2 from a voltage reflection coefficient, e.g., Γmi1(ST2)n, Γmi2(ST2)n, etc., received from the sensor 124 for the state transition ST2, the processor 134 receives the voltage reflection coefficient to generate a plurality of corresponding load voltage reflection coefficients, e.g., ΓL1(ST2)n, ΓL2(ST2)n, etc., at the output 144 of the model system 102. The plurality of corresponding load voltage reflection coefficients are applied at the output 144 of the model system 102 in the same manner in which the load impedances, e.g., ZL1(ST2)n, ZL2(ST2)n, etc., for the state transition ST2 are applied at the output of the model system 102. There is no need to convert from a voltage reflection coefficient to impedance and vice versa.

In some embodiments, instead of the voltage reflection coefficient values Γmi1(ST2)n and Γmi2(ST2)n for the state transition ST2, statistical values, e.g., average values, moving average values, etc., of the voltage reflection coefficient values Γmi1(ST2)n and Γmi2(ST2)n are calculated by the processor 134 and provided to the input 142 of the model system for calculation of load impedance values at the output 144 of the model system 102. For example, instead of applying the voltage reflection coefficient values Γmi2(ST2)n to the input 142 of the model system 102, average values determined from the voltage reflection coefficient values Γmi1(ST2)n and Γmi2(ST2)n by the processor 134 are provided as input to the model system 102 to calculate the load impedances ZL2(ST2)n at the output 144 of the model system 102. To further illustrate, a first average value of voltage reflection coefficient values Γmi1(ST2)1 and Γmi2(ST2)1 is determined by the processor 134 and the first average value is forward propagated via the model system 102 to generate the load impedance value ZL2(ST2)1. Moreover, a second average value of voltage reflection coefficient values Γmi1(ST2)2 and Γmi2(ST2)2 is determined by the processor 134 and the second average value is forward propagated via the model system 102 to generate the load impedance value ZL2(ST2)2.

In some embodiments, each of the measured voltage reflection coefficients Γmi2(ST2)n is weighted by the processor 134 according to a pre-assigned weight. The weights applied by the processor 134 to the voltage reflection coefficients Γmi2(ST2)n are received as inputs via the input device by the processor 134 and are determined based on engineering knowledge and/or the process conditions. Instead of applying the voltage reflection coefficients Γmi2(ST2)n, weighted voltage reflection coefficients wΓmi2(ST2)n are applied to determine the load impedances ZL2(ST2)n, where w are the weights.

Figure 8:
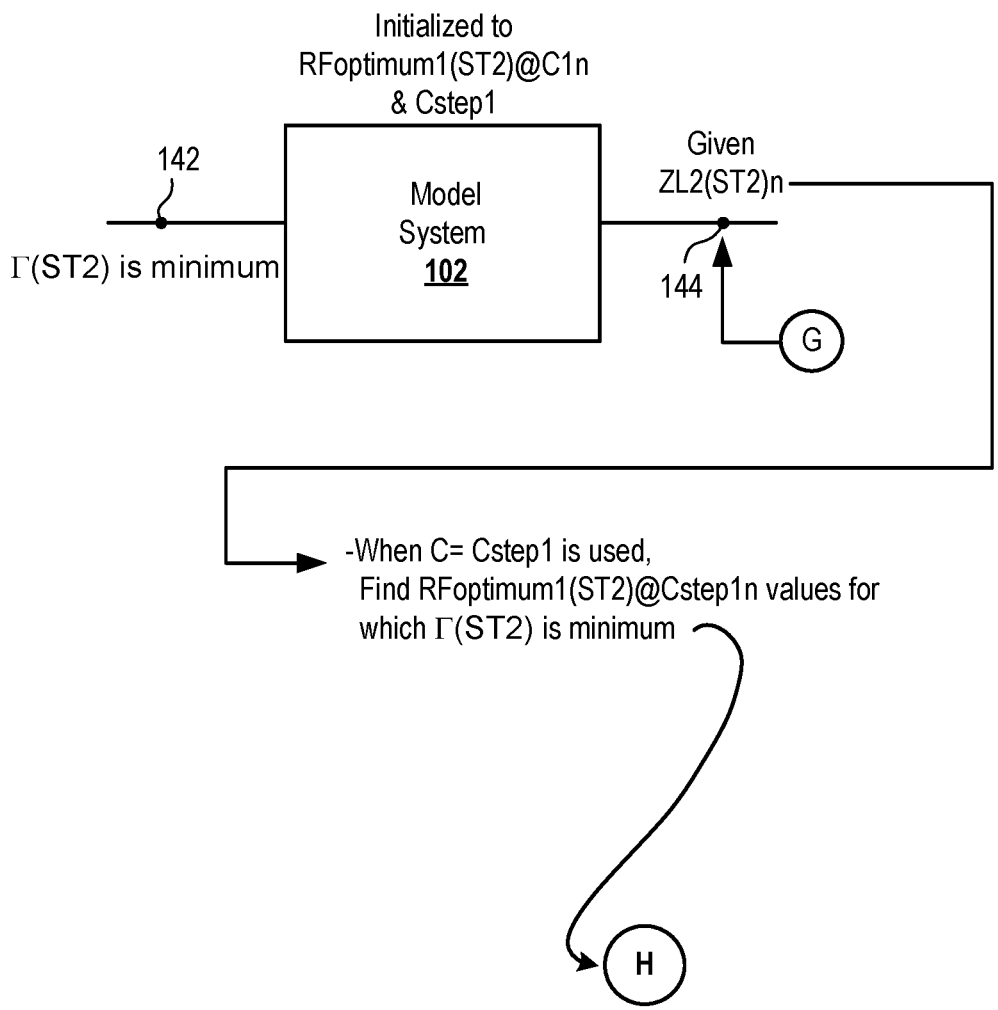
FIG. 8 is a diagram of an embodiment of the model system that is initialized to have the radio frequency values RFoptimum1(ST2)@C1n and the variable capacitance Cstep1 to determine a plurality of radio frequency values RFoptimum1(ST2)@ Cstep1n.

FIG. 8 is a diagram of an embodiment of the model system 102 that is initialized to have the radio frequency values RFoptimum1(ST2)@C1n and the variable capacitance Cstep1 to determine a plurality of radio frequency values RFoptimum1(ST2)@Cstep1n. For each of the radio frequency values RFoptimum1(ST2)@Cstep1n, the voltage reflection coefficient Γ(ST2) for the state transition ST2 at the input 142 is minimum. The processor 134 calculates from the load impedances ZL2(ST2)n and the model system 102 the plurality of radio frequency values RFoptimum1(ST2)@Cstepn. For each of the radio frequency values RFoptimum1(ST2)@Cstepn, the voltage reflection coefficient Γ(ST2) is minimum from among multiple values of the voltage reflection coefficient Γ(ST2). For example, the processor 134 back propagates the load impedance ZL2(ST2)1 via the model system 102, which is set to have the radio frequency value RFoptimum1(ST2)@C11 and the variable capacitance Cstep1, to determine the radio frequency value RFoptimum1(ST2)@Cstep11 that generates at the input 142 an input impedance Z13 for the state transition ST2. The processor 134 calculates a voltage reflection coefficient Γ(ST2)13 from the input impedance Z13 in a manner similar to that described above using equation (1). Moreover, the processor 134 back propagates the load impedance ZL2(ST2)1 via the model system 102, which is set to have the radio frequency value RFoptimum1(ST2)@C11 and the variable capacitance Cstep1, to determine the radio frequency value RFoptimum1(ST2)@Cstep1_1 that generates at the input 142 an input impedance Z14 for the state transition ST1. The processor 134 calculates a voltage reflection coefficient Γ(ST2)14 from the input impedance Z14 in a manner similar to that described above using equation (1). The processor 134 determines that the voltage reflection coefficient Γ(ST2)13 is less than the voltage reflection coefficient Γ(ST2)14, and determines that the radio frequency value RFoptimum1(ST2)@Cstep11 is one for which the voltage reflection coefficient Γ(ST2)13 is a minimum.

As another example, the processor 134 back propagates the load impedance ZL2(ST2)2 via the model system 102, which is initialized to have the radio frequency RFoptimum1(ST2)@C12 and the variable capacitance Cstep1, to determine the radio frequency value RFoptimum1(ST2)@Cstep12 that generates at the input 142 an input impedance Z15 for the state transition ST2. The processor 134 calculates a voltage reflection coefficient Γ(ST2)15 from the input impedance Z15 in a manner similar to that described above using equation (2). Moreover, the processor 134 back propagates the load impedance ZL2(ST2)2 via the model system 102, which is initialized to have the radio frequency RFoptimum1(ST2)@C12 and the variable capacitance Cstep1, to determine a radio frequency value RFoptimum1(ST2)@Cstep1_2 that generates at the input 142 an input impedance Z16 for the state transition ST2. The processor 134 calculates a voltage reflection coefficient Γ(ST2)16 from the input impedance Z16 in a manner similar to that described above using equation (2). The processor 134 determines that the voltage reflection coefficient Γ(ST2)15 is less than the voltage reflection coefficient Γ(ST2)16, and determines that the radio frequency value RFoptimum1(ST2)@Cstep12 is one for which the voltage reflection coefficient Γ(ST2)15 is a minimum.

It should be noted that the value ZL2(ST2)1 is determined from the load value Zmi2(ST2)1, which is measured at an end of the first time period, e.g., t1, etc., from an end of the state S2. The value ZL2(ST2)2 is determined from the load value Zmi2(ST2)2, which is measured at an end of the second time period, e.g., t2, etc., from the first time period t1 from the end of the state S2. The second time period from the state S2 is consecutive to the first time period from the state S2. The voltage reflection coefficient Γ(ST2)13 is a minimum among all voltage reflection coefficients for the first time period and the voltage reflection coefficient Γ(ST2)15 is a minimum among all voltage reflection coefficients for the second time period.

In some embodiments, a non-linear least squares optimization routine is executed by the processor 134 to solve for and calculate from the load impedances ZL2(ST2)n and the model system 102 the radio frequency values RFoptimum1(ST2)@Cstep1n. For each of the radio frequency values RFoptimum1(ST2)@Cstep1n, the voltage reflection coefficient Γ(ST2) for the state transition ST2 is minimum. In various embodiments, pre-determined equations are applied by the processor 134 to solve for and calculate from the load impedance ZL2(ST2)n and the model system 102 the radio frequency values RFoptimum1(ST2)@Cstep1n.

In some embodiments, operations described herein with reference to FIGS. 3 and 4 are performed during a first occurrence of the state transition ST2 and operations described herein as with reference to FIG. 7 is during a second occurrence of the state transition ST2. For example, the state transition ST1 that is described with reference to FIGS. 5 and 6 is consecutive to the state transition ST2 described with reference to FIGS. 3 and 4. There is no state transition between the state transition ST2 as is described using FIGS. 3 and 4, and the state transition ST1 as is described using FIGS. 5 and 6. To illustrate, the state transition ST2 described with reference to FIGS. 3 and 4 is immediately followed by the state S1, which is immediately followed by the state transition ST1 described with reference to FIGS. 5 and 6. Moreover, in the example, the state transition ST2 that is described with reference to FIGS. 7 and 8 is consecutive to the state transition ST1 described with reference to FIGS. 5 and 6. There is no state transition between the state transition ST1 as is described using FIGS. 5 and 6, and the state transition ST2 as is described using FIGS. 7 and 8. To illustrate, the state transition ST1 described with reference to FIGS. 5 and 6 is immediately followed by the state S2, which is immediately followed by the state transition ST2 described with reference to FIGS. 7 and 8.

In various embodiments, the second occurrence of the state transition ST2 occurs after one or more intermediate occurrences of the state transition ST2, which occur after the first occurrence of the state transition ST2. For example, the second occurrence of the state transition ST2 that is described with reference to FIGS. 7 and 8 occurs after one or more occurrences of the state transition ST2 and the one or more occurrences occur after the first occurrence of the state transition ST2 that is described with reference to FIGS. 3 and 4.

Figure 9:
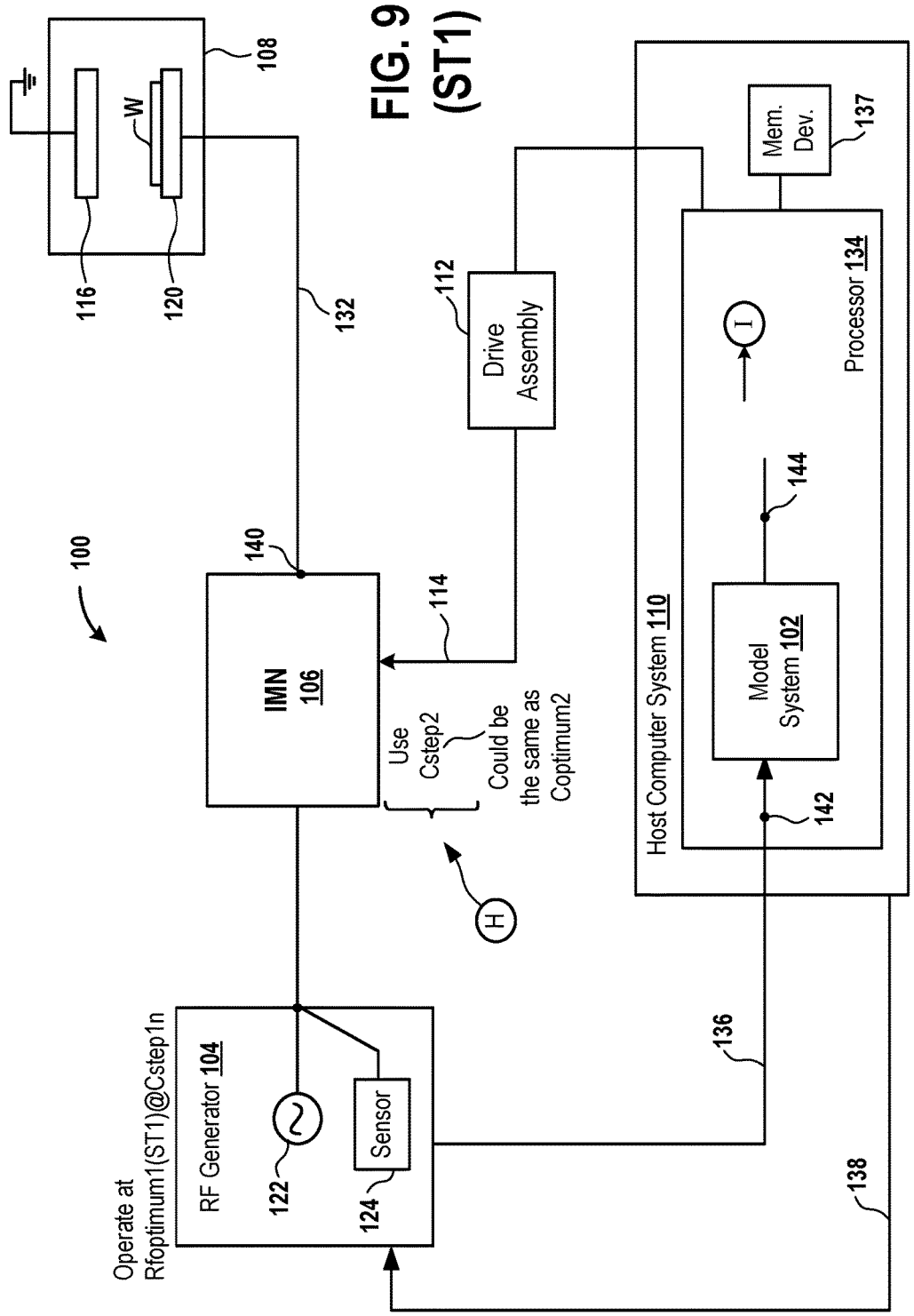
FIG. 9 is a diagram of an embodiment of the plasma system to illustrate use of a capacitance value Coptimum2, and use of the radio frequency values RFoptimum1(ST1) @Cstep1n to process a wafer W during the state transition ST1.

FIG. 9 is a diagram of an embodiment of the plasma system 100 to illustrate use of a capacitance value Coptimum2, and use of the radio frequency values RFoptimum1 (ST1)@Cstep1n to process the wafer W during the state transition ST1. It should be noted that a manner of determining the capacitance value Coptimum2 is described in the U.S. patent application Ser. No. 15/098,189. The processor 134 modifies the recipe during the state transition ST1 to include the radio frequency values RFoptimum1(ST1) @Cstep1n and provides the radio frequency values RFoptimum1(ST1)@Cstep1n to the RF generator 104. When the values RFoptimum1(ST1)@Cstep1n are used instead of the values RFoptimum1(ST1)@C1n, a lesser amount of power is reflected towards the RF generator 104 during the state transition ST1.

Moreover, the processor 134 controls the drive assembly 112 so that the combined variable capacitance of the impedance matching network 106 is set at the value Cstep2. It should be noted that in some embodiments, the combined variable capacitance Cstep2 is the same as the combined variable capacitance Coptimum2

During the state transition ST1, when the combined variable capacitance of the impedance matching network 106 is Cstep2, the RF generator 104 generates the RF signal having the radio frequency values RFoptimum1(ST1) @Cstepin. The RF signal having the radio frequency values RFoptimum1(ST1)@Cstepin passes via the impedance matching network 106 to generate the modified signal, which is provided to the lower electrode 118 for processing the wafer W during the state transition ST1.

In various embodiments, the combined variable capacitance Cstep2 is closer to the combined variable capacitance Coptimum2 compared to the combined variable capacitance Cstep1. For example, the combined variable capacitance Cstep2 is greater than the combined variable capacitance Cstep1, and the combined variable capacitance Coptimum2 is greater than the combined variable capacitance Cstep2. As another example, the combined variable capacitance Cstep2 is less than the combined variable capacitance Cstep1, and the combined variable capacitance Coptimum2 is less than the combined variable capacitance Cstep2.

Figure 10:
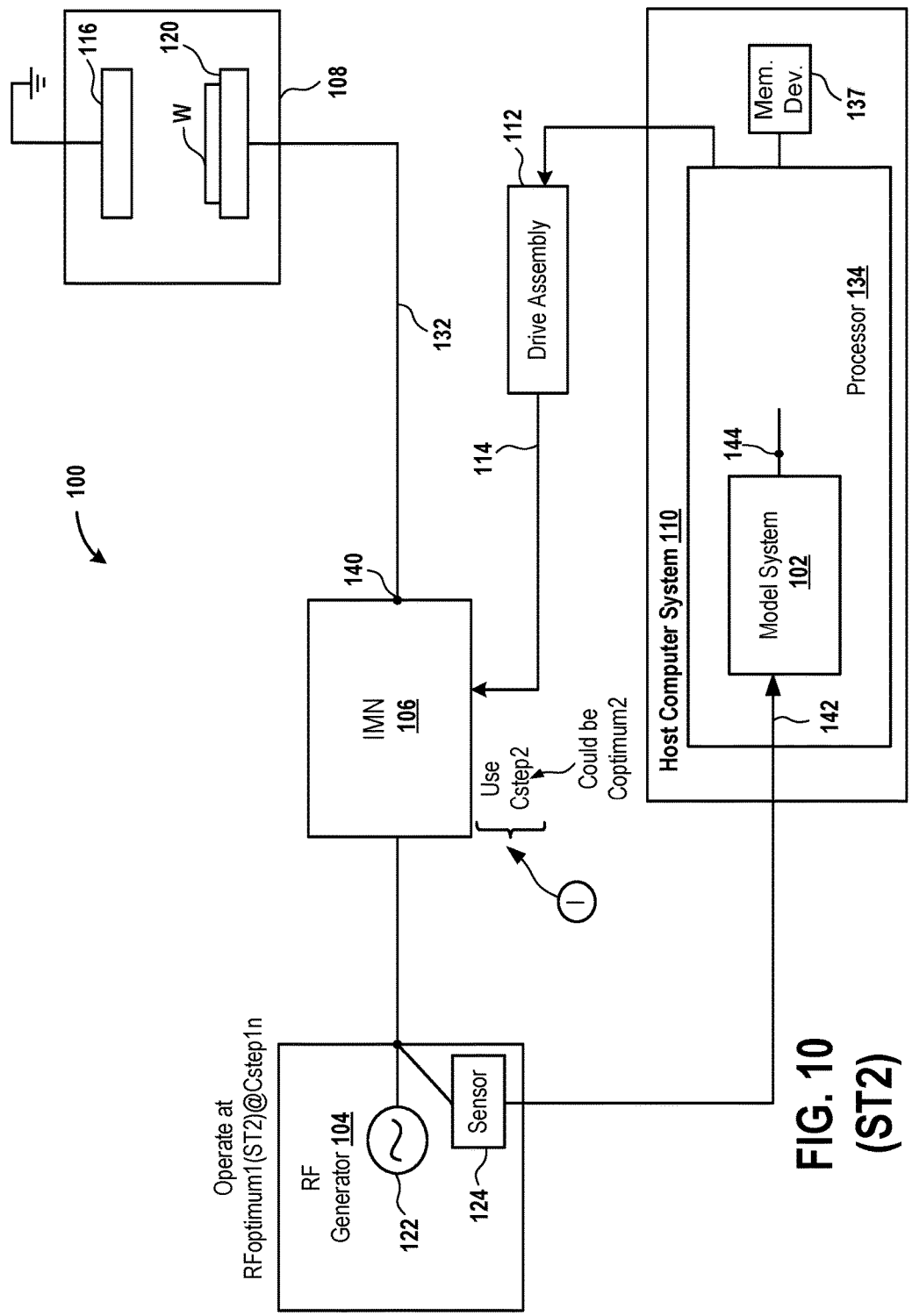
FIG. 10 is a diagram of an embodiment of the plasma system to illustrate use of the capacitance value Coptimum2, and use of the values RFoptimum1(ST2)@Cstep1n to process the wafer W during the state transition ST2.

FIG. 10 is a diagram of an embodiment of the plasma system 100 to illustrate use of the capacitance value Coptimum2, and use of the values RFoptimum1(ST2)@Cstepin to process the wafer W during the state transition ST2. The processor 134 modifies the recipe during the state transition ST2 to include the radio frequency values RFoptimum1 (ST2)@Cstepin and provides the radio frequency values RFoptimum1(ST2)@Cstepin to the RF generator 104. When the values RFoptimum1(ST2)@Cstepin are used instead of the values RFoptimum1(ST2)@C1n, a lesser amount of power is reflected towards the RF generator 104 during the state transition ST2. Moreover, the processor 134 controls the drive assembly 112 so that the combined variable capacitance of the impedance matching network 106 is set at the value Cstep2.

During the state transition ST2, when the combined variable capacitance of the impedance matching network 106 is Cstep2, the RF generator 104 generates the RF signal having the radio frequency values RFoptimum1(ST2) @Cstepin. The RF signal having the radio frequency values RFoptimum1(ST2)@Cstepin passes via the impedance matching network 106 to generate the modified signal, which is provided to the lower electrode 118 for processing the wafer W during the state transition ST2.

In this manner, for the state transitions ST1 and ST2, instead of applying the combined variable capacitance value Coptimum2 directly from the combined variable capacitance value C1, a step approach in which the combined variable capacitance value Cstep1 is applied with the radio frequency values RFoptimum1(ST1)@C1n first for the state transition ST1, followed by applying the combined variable capacitance value Cstep1 with the radio frequency values RFoptimum1(ST2)@C1n for the state transition ST2 second, followed by applying the combined variable capacitance value Cstep2 with the radio frequency values RFoptimum1(ST1)@Cstep1n for the state transition ST1 third, followed by applying the combined variable capacitance value Cstep2 with the radio frequency values RFoptimum1 (ST2)@Cstep1n for the state transition ST2 fourth. For example, the application of the combined variable capacitance value Cstep2 and the radio frequency values RFoptimum1(ST1)@Cstep1n precedes the application of the combined variable capacitance value Cstep2 with the radio frequency values RFoptimum1(ST2)@Cstep1n. Also, the application of the combined variable capacitance value Cstep1 with the radio frequency values RFoptimum1(ST2) @C1n precedes the application of the combined variable capacitance value Cstep2 and the radio frequency values RFoptimum1(ST1)@Cstep1n. The application of the combined variable capacitance value Cstep1 is applied with the radio frequency values RFoptimum1(ST1)@C1n precedes the application of the combined variable capacitance value Cstep1 with the radio frequency RFoptimum1(ST2)@C1n.

Figure 11:
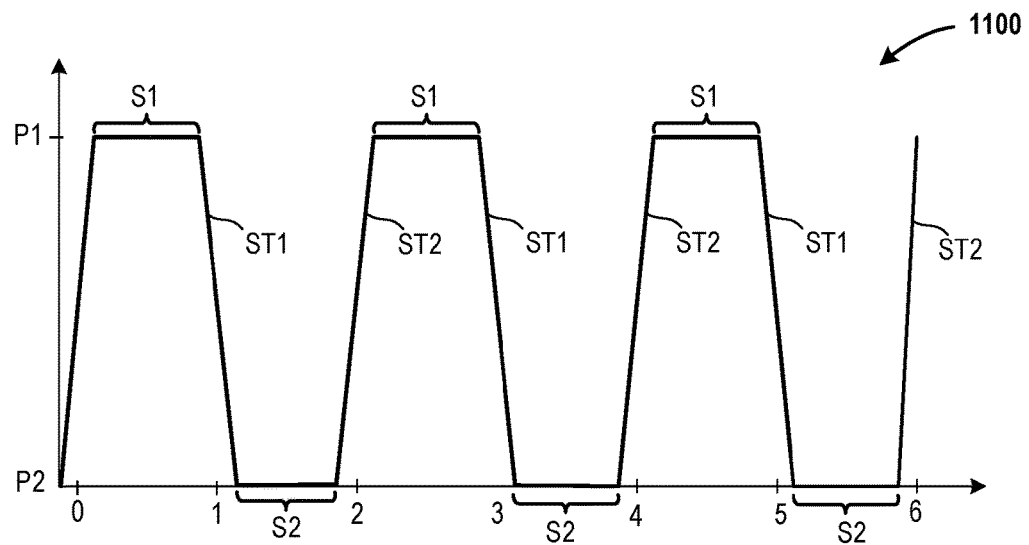
FIG. 11 is an embodiment of a graph to illustrate the state transitions ST1 and ST2 of an RF signal that is generated by an RF generator.

FIG. 11 is an embodiment of a graph 1100 to illustrate the state transitions ST1 and ST2 of an RF signal that is generated by the RF generator 104 (FIG. 1). The graph 1100 plots a power level versus time t. As shown in the graph 1100, there are the two states S1 and S2. The state S1 has one RF power level of the RF signal that is generated by the RF generator 104 and an RF frequency of the RF signal. The state S2 has another RF power level of the RF signal that is generated by the RF generator 104 and a different RF frequency of the RF signal. For at least one clock cycle of the clock signal, both the state transitions ST and ST2 share the same value of the variable capacitor, within the impedance matching network 106, having the combined variable capacitance.

As shown, the state S1 has a power level P1 and the state S2 has a power level P2. For example, the power level P1 is an envelope of the RF signal, e.g., a sinusoidal signal, etc., during the state S1 and the power level P2 is an envelope of the RF signal during the state S2. As another example, all power amounts of the RF signal during the state S2 have lower values than power amounts of the RF signal during the state S1. The power level P1 is greater than the power level P2.

There is a slope, other than a vertical slope, e.g. infinite slope, etc., while transitioning from the state S1 to the state S2 and while transitioning from the state S2 to the state S1. In some embodiments, the transitions from the state S1 to the state S2 and the state S2 to the state S1 are created by radio frequency values, e.g., the RFoptimum1(ST1)@C1$n$ values, the RFoptimum1(ST2)@C1$n$ values, the RFoptimum1(ST1)@Cstep1$n$ values, the RFoptimum1(ST2)@Cstep1$n$ values, etc. For example, the slope in the transition from the state S1 to the state S2 indicates application of the radio frequency values, e.g., the RFoptimum1(ST1)@C1$n$ values or the RFoptimum1(ST1)@Cstep1$n$ values, etc. As another example, the slope in the transition from the state S2 to the state S1 indicates application of the radio frequency values, e.g., the RFoptimum1(ST2)@C1$n$ values or the RFoptimum1(ST2)@Cstep1$n$ values, etc.

In various embodiments, both the states S1 and S2 have the same frequency or set of frequencies. In some embodiments, instead of a straight line, any of the state transitions ST1 and ST1 is represented using a curve, a line, a step, or a combination thereof.

Figure 12:
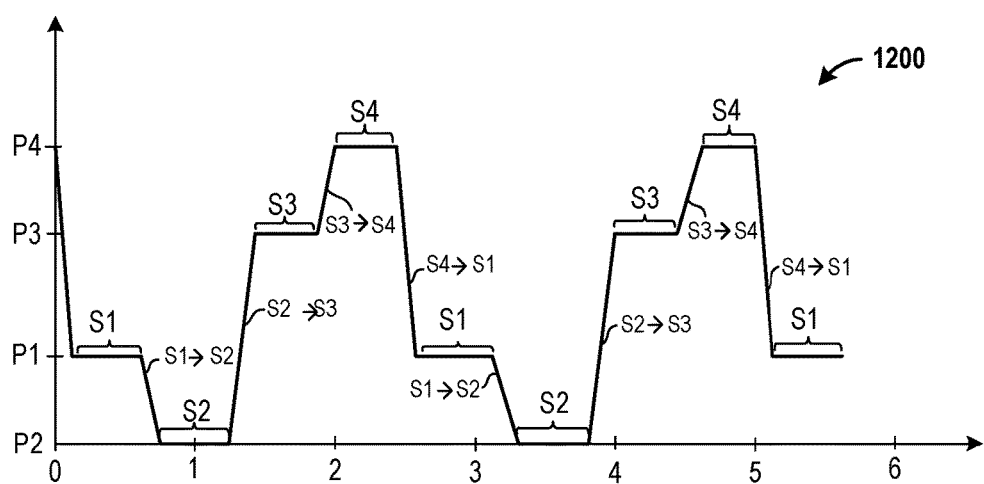
FIG. 12 is an embodiment of a graph to illustrate more than two states of an RF signal generated by the RF generator and more than two state transitions of the RF signal.

FIG. 12 is an embodiment of a graph 1200 to illustrate more than two states of an RF signal generated by the RF generator 104 (FIG. 1) and more than two state transitions. As shown in the graph 1200, plasmas are operated with multiple RF states, e.g., S1, S2, S3, S4, etc. The graph 1200 plots a power level versus the time t. The RF signal, as shown in the graph 1200, has four states, S1, S2, S3, and S4. The RF signal transitions from the state S1 to the state S2 further to the state S3 and to the state S4. A state transition between the states S1 and S2 is indicated as S1→S2 in FIG. 12, a state transition between the states S2 and S3 is indicated as S2→S3 in FIG. 12, a state transition between the states S3 and S4 is indicated as S3→S4 in FIG. 12, and a state transition between the states S4 and S1 is indicated as S4→S1 in FIG. 12.

The power level P2 of the state S2 is lower than a power level P1 of the state S1. The power level P1 of the state S1 is lower than a power level P3 of the state S3, and the power level P3 is lower than the power level P4 of the state S4. For example, the power level P2 is an envelope of the RF signal during the state S2, the power level P1 is an envelope of the RF signal during the state S1, the power level P3 is an envelope of the RF signal during the state S3, and the power level P4 is an envelope of the RF signal during the state S4.

As shown in the graph 1200, power and frequency values ramp between two consecutive states, e.g., the state S1 and the state S2, or the state S2 and the state S3, or the state S3 and the state S4, or the state S4 and the state S1, etc. Load impedances are periodically determined during the ramp. For example, a load impedance value is determined by the processor 134 every 5 to 10 microseconds. The model system 102 is executed by the processor 134 to determine optimum RF frequency values from the load impedance values during the ramp. In some embodiments, the RF frequency values are applied to a subsequent state transition of the same type. For example, when RF frequency values are calculated for a first state transition ST1, the RF frequency values are applied during a second state transition ST1 that is next to the first state transition ST1. For example, the first state transition ST1 is followed by the state S2, which is followed by the state transition ST2, which is followed by the state S1, which is followed by the second state transition ST1. As another example, when RF frequency values are calculated for a first state transition ST2, the RF frequency values are applied during a second state transition ST2 that is next to the first state transition ST2. For example, the first state transition ST2 is followed by the state S1, which is followed by the state transition ST1, which is followed by the state S2, which is followed by the second state transition ST2.

It should be noted that the above-described embodiments described with respect to FIGS. 1 through 10 are applicable to the RF signal having more than two states and more than two state transitions. For example, when an RF signal having three states S1, S2, and S3 is generated by the RF generator 104, another plurality of load impedances ZL1(ST3)$n$ at the output 144 of the model system 102 is determined for the state S3 in the same manner in which the load impedances ZL1(ST1)$n$ are determined using FIG. 1. Moreover, a plurality of RF values RFoptimum1(ST3)@C1$n$ for the state S3 is determined in the same manner in which the RF values RFoptimum1(ST1)@C1$n$ are determined using FIG. 2 except that to determine the RF values RFoptimum1(ST3)@C1$n$, a voltage reflection coefficient Γ(ST3) for a state transition ST3 is minimized. The state transition ST3 is a transition from the state S2 to the state S3. Also, yet another plurality of load impedances ZL2(ST3)$n$ at the output 144 of the model system 102 is determined for the state transition ST3 in the same manner in which the load impedances ZL2(ST1)$n$ are determined using FIG. 5. Moreover, a plurality of RF values RFoptimum1(ST3)@Cstep1$n$ for the state transition ST3 are determined in the same manner in which the RF values RFoptimum1(ST1)@Cstep1$n$ are determined using the FIG. 6 except that the voltage reflection coefficient Γ(ST3) is minimized. During the state transition ST3 of the RF signal generated by the RF generator, the RF values RFoptimum1(ST3)@Cstep1$n$ are applied to the RF generator 104 and the combined variable capacitance Cstep2 is applied to the impedance matching network 106.

In various embodiments, a frequency level of the state S4 is greater than or lower than a frequency level of the state S3. Similarly, a frequency level of the state S2 is greater than or lower than a frequency level of the state S3.

In various embodiments, the power level of the state S1 is lower than the power level of the state S2. In several embodiments, the power level of the state S4 is lower than the power level of the state S3 and a frequency level of the state S4 is greater than or lower than a frequency level of the state S3. In some embodiments, the power level of the state S2 is greater than the power level of the state S3 and a frequency level of the state S2 is greater than or lower than a frequency level of the state S3.

In several embodiments, a power level of a first state, e.g., S1, S2, S3, S4, etc., is greater than or less than a power level of a second state, e.g., S1, S2, S3, S4, etc. Moreover, a frequency level of the first state is greater than or less than a frequency level of the second state.

In various embodiments, N states, e.g., 8 states, 16 states, etc., of an RF signal generated by the RF generator 104 are used, where N is an integer greater than or equal to two. In various embodiments, a clock cycle of the clock signal during which the N states or (N−1) states occur is the same. For example, two state of an RF signal occur within the same time period in which three states of the RF signal occur.

It should be noted that in some of the above-described embodiments, an RF signal is supplied to the lower electrode of the chuck 118 and the upper electrode 116 is grounded. In various embodiments, an RF signal is applied to the upper electrode 116 and the lower electrode of the chuck 118 is grounded.

In some embodiments, multiple RF values are used to tune the RF generator 104 and the impedance matching network 104 during each of the states of the RF generator.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSP)s, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, the x MHz RF generator, the y MHz RF generator, and the z MHz RF generator are coupled to an inductor within the ICP plasma chamber. Examples of a shape of the inductor include a solenoid, a dome-shaped coil, a flat-shaped coil, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for reducing power reflected towards a radio frequency (RF) generator during state transitions by using radio frequency values, comprising:
receiving during a first type of state transition of the RF generator a first plurality of measured input parameter values sensed between an output of the RF generator and an input of an impedance matching network when the RF generator operates at a first plurality of radio frequency values and the impedance matching network has a first variable measurable factor;
initializing for the first type of state transition one or more computer-generated models to have the first variable measurable factor and the first plurality of radio frequency values, wherein the one or more computer-generated models include a model of the impedance matching network;
determining for the first type of state transition a first plurality of output parameter values using the one or more computer-generated models from the first plurality of measured input parameter values when the one or more computer-generated models have the first variable measurable factor and the first plurality of radio frequency values;
generating, using the first plurality of output parameter values and the one or more computer-generated models, a first plurality of favorable radio frequency values, wherein for each of the favorable radio frequency values of the first plurality, a reflection coefficient for the first type of state transition at an input of the one or more computer-generated models is minimum;
operating the RF generator at the first plurality of favorable radio frequency values during the first type of state transition to reduce the power reflected towards the RF generator.

2. The method of claim 1, wherein said receiving, initializing, determining the first plurality of output parameter values, and generating the first plurality of favorable radio frequency values are performed during a first occurrence of the first type of state transition, wherein said operating the RF generator is performing is performed during a second occurrence of the first type of state transition.

3. The method of claim 2, wherein the second occurrence follows the first occurrence after one or more intermediate occurrences of the first type of state transition.

4. The method of claim 2, wherein the second occurrence immediately follows the first occurrence without any occurrences of the first type of state transition occurring between the first occurrence and the second occurrence.

5. The method of claim 1, further comprising:
receiving during a second type of state transition of the RF generator a second plurality of measured input parameter values sensed between the output of the RF generator and the input of the impedance matching network when the RF generator operates at a second plurality of radio frequency values and the impedance matching network has the first variable measurable factor;
initializing for the second type of state transition the one or more computer-generated models of the impedance matching network to have the first variable measurable factor and the second plurality of radio frequency values;
calculating for the second type of state transition a second plurality of output parameter values using the one or more computer-generated models from the second plurality of measured input parameter values when the one or more computer-generated models has the first variable measurable factor and the second plurality of radio frequency values;
calculating, using the second plurality of output parameter values and the one or more computer-generated models, a second plurality of favorable radio frequency values, wherein for each of the favorable radio frequency values of the second plurality, a reflection coefficient for the second type of state transition at the input of the one or more computer-generated models is minimum;

controlling during the second type of state transition the RF generator to operate at the second plurality of favorable radio frequency values.

6. The method of claim 5, wherein said receiving the second plurality of measured input parameter values, initializing for the second type of state transition the one or more computer-generated models, calculating the second plurality of output parameter values, and calculating the second plurality of favorable radio frequency values are performed during a first occurrence of the second type of state transition, wherein said controlling the RF generator is performed during a second occurrence of the second type of state transition.

7. The method of claim 6, wherein the second occurrence of the second type of state transition follows the first occurrence of the second type of state transition after one or more intermediate occurrences of the second type of state transition.

8. The method of claim 6, wherein the second occurrence of the second type of state transition immediately follows the first occurrence of the second type of state transition without any occurrences of the second type of state transition occurring between the first occurrence of the second type of state transition and the second occurrence of the second type of state transition.

9. The method of claim 5, further comprising:

receiving during the first type of state transition of the RF generator a third plurality of measured input parameter values sensed between the output of the RF generator and the input of the impedance matching network when the RF generator operates at the first plurality of favorable radio frequency values and the impedance matching network has a first step variable measurable factor;

initializing for the first type of state transition the one or more computer-generated models of the impedance matching network to have the first step variable measurable factor and the first plurality of favorable radio frequency values;

calculating for the first type of state transition a third plurality of output parameter values using the one or more computer-generated models from the third plurality of measured input parameter values when the one or more computer-generated models has the first step variable measurable factor and the first plurality of favorable radio frequency values;

calculating, using the third plurality of output parameter values and the one or more computer-generated models, a third plurality of favorable radio frequency values, wherein for each of the favorable radio frequency values of the third plurality, the reflection coefficient for the first type of state transition at the input of the one or more computer-generated models is minimum;

controlling during the first type of state transition the RF generator to operate at the third plurality of favorable radio frequency values.

10. The method of claim 9, further comprising:

receiving during the second type of state transition of the RF generator a fourth plurality of measured input parameter values sensed between the output of the RF generator and the input of the impedance matching network when the RF generator operates at the second plurality of favorable radio frequency values and the impedance matching network has the first step variable measurable factor;

initializing for the second type of state transition the one or more computer-generated models of the impedance matching network to have the first step variable measurable factor and the second plurality of favorable radio frequency values;

calculating for the second type of state transition a fourth plurality of output parameter values using the one or more computer-generated models from the fourth plurality of measured input parameter values when the one or more computer-generated models has the first step variable measurable factor and the second plurality of favorable radio frequency values;

calculating, using the fourth plurality of output parameter values and the one or more computer-generated models, a fourth plurality of favorable radio frequency values, wherein for each of the favorable radio frequency values of the fourth plurality, the reflection coefficient for the second type of state transition at the input of the one or more computer-generated models is minimum;

controlling during the second type of state transition the RF generator to operate at the fourth plurality of favorable radio frequency values.

11. The method of claim 1, wherein during the first type of state transition, the RF generator transitions from a first power level to a second power level, wherein the second power level is lower than the first power level.

12. The method of claim 1, wherein the one or more computer-generated models include a model of an RF transmission line and a model of an RF cable.

13. The method of claim 1, wherein determining for the first type of state transition the first plurality of output parameter values using the one or more computer-generated models from the first plurality of measured input parameter values when the one or more computer-generated models has the first variable measurable factor and the first plurality of radio frequency values comprises:

determining for the first type of state transition a first one of the first plurality of output parameter values using the one or more computer-generated models from a first one of the first plurality of measured input parameter values when the one or more computer-generated models has the first variable measurable factor and a first one of the first plurality of radio frequency values; and determining for the first type of state transition a second one of the first plurality of output parameter values using the one or more computer-generated models from a second one of the first plurality of measured input parameter values when the one or more computer-generated models has the first variable measurable factor and a second one of the first plurality of radio frequency values.

14. The method of claim 1, wherein generating, using the first plurality of output parameter values and the one or more computer-generated models, the first plurality of favorable radio frequency values comprises:

determining for a first one of the first plurality of output parameter values, a first one of the first plurality of favorable radio frequency values for which the reflection coefficient for the first type of state transition at the input of the one or more computer-generated models has a first minimum value; and determining for a second one of the first plurality of output parameter values, a second one of the first plurality of favorable radio frequency values for which the reflection coefficient for the first type of state transition at the input of the one or more computer-generated models has a second minimum value.

\* \* \* \* \*